United States Patent
Counts et al.

(10) Patent No.: US 12,114,453 B2
(45) Date of Patent: Oct. 8, 2024

(54) CORE SHELL WITH VARIOUS FILLER MATERIALS FOR ENHANCED THERMAL CONDUCTIVITY

(71) Applicant: Apple Inc., Cupertino, CA (US)

(72) Inventors: William A. Counts, Sunnyvale, CA (US); Andrew W. Meschke, San Jose, CA (US); Lei Gao, Shanghai (CN); Abhijeet Misra, Sunnyvale, CA (US); Alexander W. Williams, Santa Clara, CA (US); Hoishun Li, San Jose, CA (US); Lee E. Hooton, Ridge, NY (US); Michael B. Wittenberg, San Francisco, CA (US); James A. Yurko, Saratoga, CA (US)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 16/449,061

(22) Filed: Jun. 21, 2019

(65) Prior Publication Data

US 2020/0245487 A1    Jul. 30, 2020

Related U.S. Application Data

(60) Provisional application No. 62/798,343, filed on Jan. 29, 2019.

(51) Int. Cl.
*H05K 5/04*          (2006.01)
*A45C 11/00*        (2006.01)
(Continued)

(52) U.S. Cl.
CPC ............... *H05K 5/04* (2013.01); *A45C 11/00* (2013.01); *G06F 1/1626* (2013.01);
(Continued)

(58) Field of Classification Search
CPC ...... H05K 5/04; H05K 5/0004; H05K 5/0213; H05K 5/03; A45C 11/00; G06F 1/1626; H04M 1/0283
See application file for complete search history.

(56) References Cited

U.S. PATENT DOCUMENTS 7,697,281 B2 *   4/2010   Dabov ................. G06F 1/1656
                                                  361/679.55
8,733,422 B2 *   5/2014   Browning .......... B23K 26/0884
                                                  29/527.3
(Continued)

FOREIGN PATENT DOCUMENTS

CN         103249267 A  *  8/2013
CN         103831590 A       6/2014
(Continued)

OTHER PUBLICATIONS

Translation of CN-103249267-A (Year: 2013).*

*Primary Examiner* — Abhishek M Rathod
(74) *Attorney, Agent, or Firm* — Dorsey & Whitney LLP

(57) ABSTRACT

A composite housing of an electronic device can include a metal shell including a first material having a first set of material properties and a surface at least partially defining an exterior surface of the electronic device. The composite housing can also include an interior portion including a second material having a second set of material properties independent of the first set of material properties and at least partially defining a feature. The interior portion can be bonded to the shell and disposed interior to the surface of the shell.

18 Claims, 14 Drawing Sheets

(51) Int. Cl.
*G06F 1/16* (2006.01)
*H04M 1/02* (2006.01)
*H05K 5/00* (2006.01)
*H05K 5/02* (2006.01)
*H05K 5/03* (2006.01)

(52) U.S. Cl.
CPC ........ *H04M 1/0283* (2013.01); *H05K 5/0004* (2013.01); *H05K 5/0213* (2013.01); *H05K 5/03* (2013.01); *A45C 2011/002* (2013.01); *G06F 2200/1633* (2013.01)

(56) References Cited

U.S. PATENT DOCUMENTS

| | | | | |
|---|---|---|---|---|
| 9,431,190 B2* | 8/2016 | McClure | ............... | G06F 3/0412 |
| 10,090,877 B2* | 10/2018 | Rayner | ............... | H05K 5/0017 |
| 2009/0245564 A1* | 10/2009 | Mittleman | ............ | H04M 1/035 |
| | | | | 381/361 |
| 2010/0061040 A1* | 3/2010 | Dabov | ................. | H04M 1/026 |
| | | | | 361/679.01 |
| 2011/0188178 A1* | 8/2011 | Myers | ................... | G06F 1/1626 |
| | | | | 361/679.01 |
| 2012/0175165 A1* | 7/2012 | Merz | .................... | H05K 5/0217 |
| | | | | 174/50 |
| 2012/0250250 A1* | 10/2012 | Tatebe | ................. | G06F 1/1656 |
| | | | | 361/679.01 |
| 2013/0248219 A1* | 9/2013 | Browning | ............. | B23K 26/32 |
| | | | | 219/121.64 |
| 2015/0261267 A1* | 9/2015 | Vadakkanmaruveedu | ................. | |
| | | | | C09K 5/14 |
| | | | | 521/143 |
| 2017/0035156 A1* | 2/2017 | Wright | ................ | A45C 13/008 |
| 2018/0070465 A1* | 3/2018 | Cater | ................. | H04M 1/0249 |
| 2019/0045642 A1* | 2/2019 | Prest | ....................... | G06F 1/163 |
| 2019/0254185 A1* | 8/2019 | Cater | ................ | H04M 1/0202 |

FOREIGN PATENT DOCUMENTS

| | | |
|---|---|---|
| CN | 103879064 A | 6/2014 |
| CN | 104717857 A | 6/2015 |
| CN | 206568640 U | 10/2017 |
| CN | 207427648 U | 5/2018 |
| CN | 108886545 A | 11/2018 |
| TW | 201422094 A | 6/2014 |
| WO | 2010077438 A1 | 7/2010 |
| WO | 2018048660 A1 | 3/2018 |

* cited by examiner

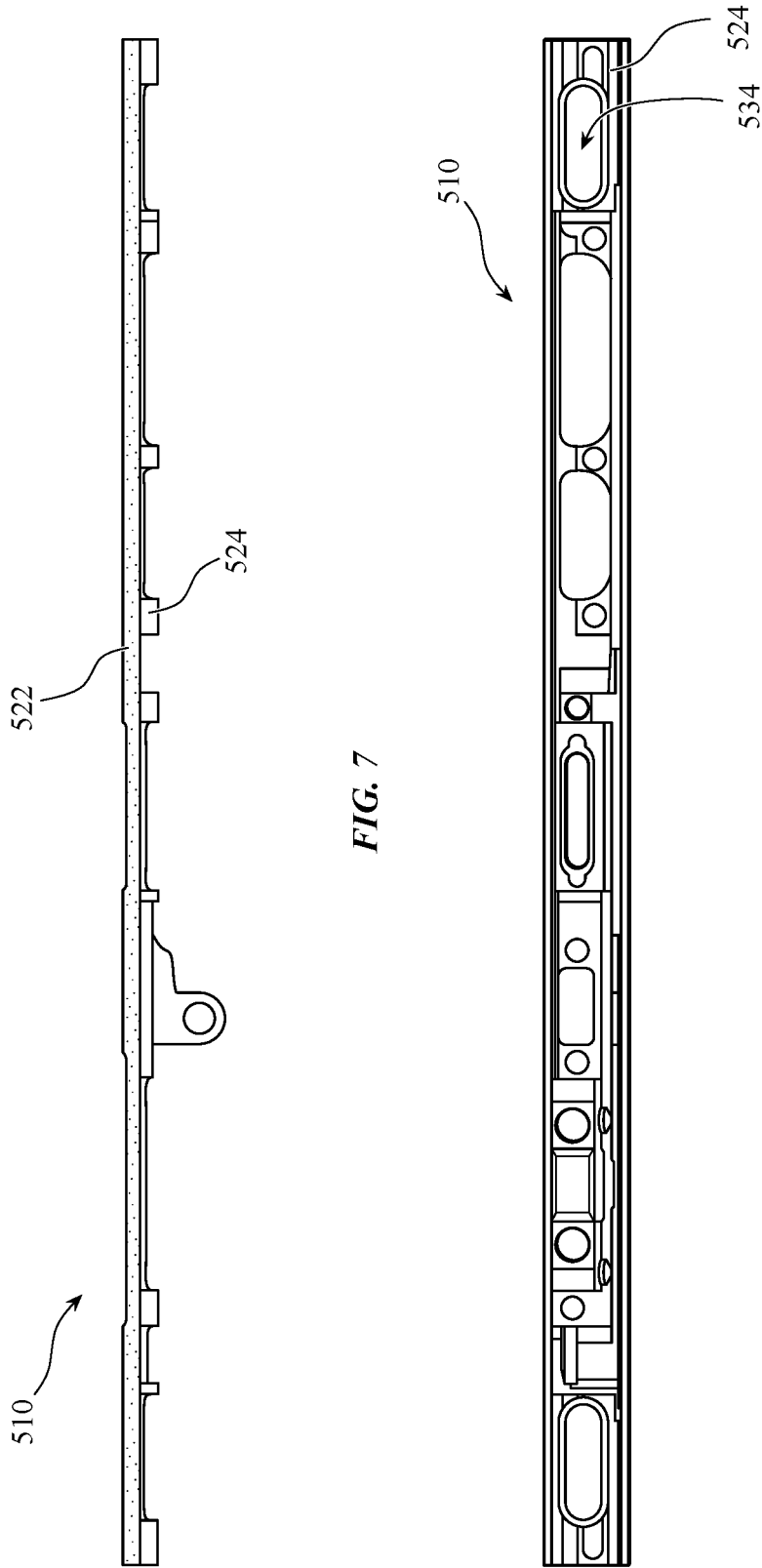

CORE SHELL WITH VARIOUS FILLER MATERIALS FOR ENHANCED THERMAL CONDUCTIVITY

CROSS-REFERENCE TO RELATED APPLICATION(S)

This application claims priority to U.S. Provisional Patent Application No. 62/798,343, filed 29 Jan. 2019, and entitled "CORE SHELL WITH VARIOUS FILLER MATERIALS FOR ENHANCED THERMAL CONDUCTIVITY," the entire disclosure of which is hereby incorporated by reference.

FIELD

The described embodiments relate generally to electronic devices. More particularly, the present embodiments relate to enclosures for electronic devices.

BACKGROUND

Electronic devices are widespread in society and can take a variety of forms, from wristwatches to computers. Electronic devices, including portable electronic devices such as handheld phones, tablet computers, and watches, can experience contact with various surfaces during use. Further, use, transportation, and storage of such devices can exert mechanical and thermal stresses thereon.

Components for these devices, such as enclosures or housings, can benefit from exhibiting different combinations of properties relating to the use of the device. A housing for a portable electronic device can have a combination of properties, such as strength, appearance, toughness, abrasion resistance, weight, corrosion resistance, thermal conductivity, electromagnetic shielding, and cost, in order for the device to function as desired. Certain materials can provide a desired level of performance with respect to some properties, but may not provide an optimal level of performance with respect to others. Accordingly, it may be desirable to provide a device enclosure that can include multiple materials to achieve a desired level of performance with respect to as many properties as desired.

SUMMARY

According to some aspects of the present disclosure, a housing of an electronic device can include a metal shell including a first material having a first set of material properties and a surface having a substantially curved shape, the surface at least partially defining an exterior surface of the electronic device, and an interior portion including a second material having a second set of material properties independent of the first set of material properties and at least partially defining a feature, the interior portion being bonded to the shell and disposed interior to the surface.

In some cases, the metal shell is pre-formed and has a thickness greater than about 25 microns. The interior portion and the shell can form a substantially unitary body. The housing can be positioned around a periphery of the electronic device and the surface can at least partially define a peripheral surface of the electronic device. The interior portion can at least partially define an interior volume of the electronic device. The interior portion can be bonded to the pre-formed shell by welding, brazing, diffusion bonding, or mechanical engagement. The housing can include an intermediate polymer layer disposed between the pre-formed shell and the interior portion, the intermediate polymer layer bonding the interior portion to the pre-formed shell. The first material can include a first metal and the second material comprises a second metal or an alloy different than the first material.

According to some aspects, a component for an electronic device can include metal outer portion having a thickness greater than about 25 microns and including a first material having a first set of material properties, the outer portion at least partially defining an exterior surface of the electronic device, and an inner portion bonded to the outer portion and including a second material having a second set of material properties independent of the first set of material properties, the inner portion defining a feature and at least partially defining an interior volume of the electronic device, wherein the inner portion and the pre-formed outer portion form a substantially unitary body.

In some cases, the first material can include a first metal and the second material comprises a second metal. The first material can include a steel or aluminum alloy and the second material comprises a copper, aluminum, or steel alloy different than the first material. The first material can include titanium and the second material comprises copper, aluminum, or steel. The inner portion can be bonded to the pre-formed outer portion by welding, brazing, diffusion bonding, or mechanical engagement. The inner portion can be bonded to the pre-formed outer portion by die casting the inner portion into the pre-formed outer portion. The component can further include an intermediate polymer layer disposed between and bonding the inner portion and the pre-formed outer portion. The intermediate polymer layer can include a heat activated film or an injection molded polymer. The inner portion can include two layers bonded together and cooperating to define the feature. The feature can be defined by both the inner portion and the pre-formed outer portion. The pre-formed outer portion can have a thickness greater than about 25 microns.

According to some aspects, a method of forming a component for an electronic device can include joining a pre-formed portion including a first material having a first material property to a second portion including a second material having a second material property independent of the first material property to form a unitary body, and forming one or more features in the second portion.

In some cases, joining can include welding or brazing the second portion to the pre-formed portion. Joining can include providing an intermediate layer between pre-formed portion and second portion. Joining can include die casting the second portion into the pre-formed portion.

BRIEF DESCRIPTION OF THE DRAWINGS

The disclosure will be readily understood by the following detailed description in conjunction with the accompanying drawings, wherein like reference numerals designate like structural elements, and in which:

FIG. 7 shows a top view of the portion of the housing of FIG. 5.

FIG. 8 shows a side view of the portion of the housing of FIG. 5.

DETAILED DESCRIPTION

Figure 1:
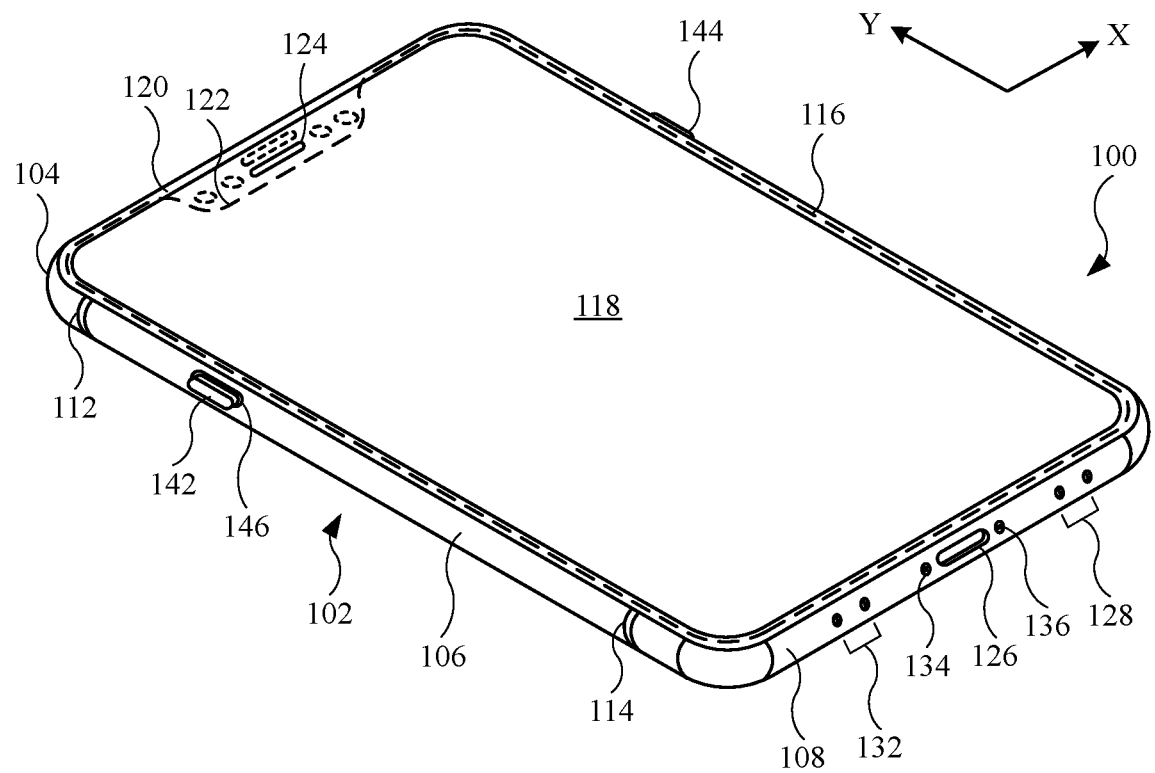
FIG. 1 shows a perspective view of an electronic device.

The present description provides examples, and is not limiting of the scope, applicability, or configuration set forth in the claims. Thus, it will be understood that changes can be made in the function and arrangement of elements discussed without departing from the spirit and scope of the disclosure, and various embodiments can omit, substitute, or add other procedures or components as appropriate. For instance, methods described can be performed in an order different from that described, and various steps can be added, omitted, or combined. Also, features described with respect to some embodiments can be combined in other embodiments.

One aspect of the present disclosure relates to composite components for electronic devices, such as frames, housings, bands, or portions thereof for an electronic device. In some examples, a composite housing for an electronic device can include a pre-formed exterior or outer portion, also referred to as a shell, having a first set of material properties. The pre-formed exterior portion can include a metallic material, such as stainless steel. The composite housing can also include an interior or inner portion, also referred to as a core, having a second, different set of material properties that are independent of the first set of material properties. For example, the interior portion can include a metallic material such as aluminum. The pre-formed exterior portion and the interior portion can be welded, bonded, adhered, or otherwise joined together such that they form the housing, or a portion thereof, and act as a substantially unitary body. That is, in some cases, the composite component can be treated as a single piece or body of material with respect to various processes, such as the manufacturing and assembly processes described herein.

In some examples, a composite construction can allow for the decoupling of the material properties of the interior, primarily structural or functional portion of the housing, from the exterior, primarily cosmetic portion of the housing. That is, the material of the inner portion can be selected to exhibit one or more properties of the composite housing while the material of the exterior portion can be independently selected to exhibit one or more other desired properties of the housing. For example, in some cases, the material and/or geometry of the inner portion can be selected to achieve a desired level of strength, weight, stiffness, cost, thermal conductivity, electromagnetic transparency, machinability, carbon footprint, recyclability, other properties, or combinations thereof. Meanwhile, the material and/or geometry of the exterior portion can be independently selected in order to achieve a desired level of hardness, corrosion resistance, scratch resistance, cosmetic finish, strength, weight, stiffness, cost, thermal conductivity, electromagnetic transparency, machinability, carbon footprint, recyclability, other properties, or combinations thereof.

For example, a housing made primarily of a material such as stainless steel can provide a desired exterior cosmetic appearance and a desired level of stiffness, but can be relatively heavy and expensive, and features, such as attachment features, can be relatively difficult to machine and can result in high levels of material waste. On the other hand, a housing made primarily of aluminum can be lightweight, low cost, and easily machined, but may not provide a desired cosmetic appearance or scratch resistance. In contrast, a composite housing, as described herein and having an exterior portion including stainless steel joined to an interior portion including aluminum, can be lightweight, low cost, and easily machined relative to an entirely steel housing, but can have the desired cosmetic appearance, hardness, and scratch resistance of stainless steel.

In some examples, the interior or inner portion of the composite housing or component can include any material that has a desired material property or properties and can be welded, bonded, adhered, or otherwise joined to an exterior portion, as described herein. For example, the interior portion of the composite housing can include organic materials such as polymeric materials, ceramic materials, metallic materials, or combinations thereof. In some examples, the interior portion of a composite housing or component, as described herein, can include a metallic material such as aluminum, copper, steel, or alloys, or combinations thereof. In some examples, the interior portion can include a metallic material having a foamed structure or a bulk metallic glass. In some cases, the interior portion can be a composite material, such as a carbon reinforced polymer material, ceramic reinforced polymer material, a metal matrix composite material, a ceramic matrix composite material, or other composite materials.

In some examples, the interior portion of the composite housing or component can be primarily, substantially entirely, or at least partially responsible for the mechanical or structural properties of the composite housing or component. That is, the properties, such as weight, stiffness, thermal conductivity, etc. of the composite housing or component can be substantially similar to the properties of the material forming the interior portion. In some examples, the interior portion of the composite housing or component can have any desired thickness. For example, as described herein, the interior portion of the composite housing can have a thickness of several millimeters and can form a frame or a band around a portion of the periphery of an electronic device. In some examples, however, the interior portion of the composite housing can have a thickness such that it extends substantially entirely across an entire width of the electronic device.

In some examples, the exterior or outer portion of the composite housing or component can include any material that has a desired material property or properties and can be welded, bonded, adhered, or otherwise joined to an interior portion, as described herein. For example, the exterior portion can include organic materials such as polymeric materials, ceramic materials, metallic materials, or combinations thereof. In some examples, the exterior portion of a composite housing or component, as described herein, can include a metallic material such as steel, titanium, aluminum, or alloys, or combinations thereof. In other examples, the exterior portion can include precious or semi-precious metals such as silver, gold, platinum, or alloys, or combinations thereof. In yet additional examples, the exterior portion can include ceramic materials, such as alumina or sapphire, zirconia, carbides, nitrides, borides, oxides, or combinations thereof. In some examples, the exterior portion can include a metallic material such as a bulk metallic glass. In other examples, the exterior portion can itself be a composite material, such as a carbon reinforced polymer material, ceramic reinforced polymer material, a metal matrix composite material, a ceramic matrix composite material, or other composite materials.

In some examples, the exterior portion of the composite housing or component can be a pre-formed or standalone article prior to being joined to the inner portion to form the composite housing or component. That is, the material of the exterior portion can be a substantially unitary body, such as a blank, bar, strip, or piece of material. In some examples, however, the exterior portion can be formed from multiple bodies of material that are joined to the interior portion to form the composite housing or component. For example, two or more strips or sections of material can be joined to an interior portion to act as an exterior portion, and thereby form the composite housing or component. In some examples, the exterior portion is not a coating. That is, in some examples, the exterior portion is not grown, deposited, coated, or otherwise formed on the interior portion.

The exterior portion of the composite housing or component can have a thickness of greater than about 25 microns, greater than about 50 microns, greater than about 100 microns, 200 microns, 300 microns, 400 microns, 500 microns, or more. In some examples, the exterior portion can have a thickness of up to about 1 millimeter, up to about 2 millimeters, or up to about 5 millimeters or more. Further, the exterior portion can have a thickness that varies along one or more positions of the exterior portion. For example, a feature can be formed in the exterior portion and the thickness adjacent to the feature can be about 1 millimeter or more, while some other areas of the exterior portion, where no feature is present, can have a thickness of about 100 microns. The desired thickness of the exterior portion can be dependent on the material of the exterior portion, the material of the interior portion, the desired properties of the final formed composite component, and combinations thereof.

The exterior portion and interior portion of the composite housing or component can be joined by any methods now known in the art or that may be developed in the future. In some examples, the exterior portion can be joined directed to the interior portion, such that a surface of the exterior portion directly contacts, abuts, is fused to, is bonded to, or is otherwise directly joined to the interior portion. In some examples, the exterior portion can be joined to the interior portion by welding, for example ultrasonic welding or laser welding, brazing, diffusion bonding, fusing, or other similar methods. In some examples, the exterior portion can form a metallurgical bond with the interior portion along at least a portion of the interface between the exterior and interior portions.

In some examples, the exterior and interior portions can be joined together with the use of an adhesive or another intermediate material. For example, the exterior and interior portions can be joined or secured together by a glue or an adhesive, such as a resin or an epoxy, by a heat activated film, by an injection molded plastic, or by similar joining methods. The exterior and interior portions can be alternatively or additionally joined or secured together via mechanical engagement between the portions. For example, features of the exterior portion can mechanically engage with features of the interior portion to mechanically join the portions together. These engagement features can range in size from nano- or micro-scaled features to macro-scale features having dimensions on the order of millimeters, and can include various combinations thereof.

In some examples, the interior portion can be formed into or onto the exterior portion such that a mechanical, metallurgical, other type of bond, or combinations thereof joins the exterior and interior portions. For example, the interior portion can be cast, molded, such as by metal injection molding, or otherwise formed into the pre-formed exterior portion. In this way, the material of the interior portion can flow into features on the surface of the exterior portion such that when the material of the interior portion solidifies, for example by cooling or curing, a mechanical, metallurgical, or other type of bond is formed between the interior and exterior portions.

Either or both of the interior and exterior portions of the composite component, such as a portion of a housing of an electronic device, can be subjected to treatment processes prior to, during, or subsequent to the joining process. For example, a surface of the exterior portion of the composite component can be subjected to a surface treatment, such as a physical vapor deposition process, after the composite component has been formed. A surface of the composite component including both the interior and exterior portion can be treated, for example, by an etching process or processes, to create one or more engagement features to facilitate joining the composite component to one or more other components of the electronic device.

These and other embodiments are discussed below with reference to FIGS. 1-16. The detailed description given herein with respect to these figures, however, is for explanatory purposes only and should not be construed as limiting.

FIG. 1 illustrates a perspective view of an embodiment of an electronic device 100. The electronic device 100 shown in FIG. 1 is a mobile wireless communication device, such as a smartphone. The smartphone of FIG. 1 is merely one representative example of a device that can be used in conjunction with the systems and methods disclosed herein. Electronic device 100 can correspond to any form of wearable electronic device, a portable media player, a media storage device, a portable digital assistant ("PDA"), a tablet computer, a computer, a mobile communication device, a GPS unit, a remote control device, or other electronic device. The electronic device 100 can be referred to as an electronic device, or a consumer device.

The electronic device 100 can have a housing that includes a band or a frame 102 that defines an outer perimeter of the electronic device 100. The band 102, or portions thereof, can be or include a composite component, as described herein. In some examples, the band 102 can include several sidewall components, such as a first sidewall component 104, a second sidewall component 106, a third sidewall component 108 (opposite the first sidewall component 104), and a fourth sidewall component (not shown in FIG. 1). The aforementioned sidewall components can be or include a composite component, as described herein.

In some instances, some of the sidewall components form part of an antenna assembly (not shown in FIG. 1). As a result, a non-metal material or materials can separate the sidewall components of the band 102 from each other in order to electrically isolate the sidewall components. For example, a first separating material 112 separates the first sidewall component 104 from the second sidewall component 106, and a second separating material 114 separates the second sidewall component 106 from the third sidewall component 108. The aforementioned materials can include an electrically inert or insulating material(s), such as plastics and/or resin, as non-limiting examples.

The electronic device 100 can further include a display assembly 116 (shown as a dotted line) that is covered by a protective cover 118. The display assembly 116 can include multiple layers (discussed below), with each layer providing a unique function. The display assembly 116 can be partially covered by a border 120 or a frame that extends along an outer edge of the protective cover 118 and partially covers an outer edge of the display assembly 116. The border 120 can be positioned to hide or obscure any electrical and/or mechanical connections between the layers of the display assembly 116 and flexible circuit connectors. Also, the border 120 can include a uniform thickness. For example, the border 120 can include a thickness that generally does not change in the X- and Y-dimensions.

Also, as shown in FIG. 1, the display assembly 116 can include a notch 122, representing an absence of the display assembly 116. The notch 122 can allow for a vision system (discussed below) that provides the electronic device 100 with information for object recognition, such as facial recognition. In this regard, the electronic device 100 can include a masking layer with openings (shown as dotted lines) designed to hide or obscure the vision system, while the openings allow the vision system to provide the object recognition information. This will be further discussed below. Also, the protective cover 118 can be formed from a transparent material, such as glass, plastic, sapphire, or the like. In this regard, the protective cover 118 can be referred to as a transparent cover, a transparent protective cover, or a cover glass (when the protective cover 118 includes glass). As shown in FIG. 1, the protective cover 118 includes an opening 124, which can represent a single opening of the protective cover 118. The opening 124 can allow for transmission of acoustical energy (in the form of audible sound) into the electronic device 100, which can be received by a microphone (not shown in FIG. 1) of the electronic device 100. The opening 124 can also, or alternatively, allow for transmission of acoustical energy (in the form of audible sound) out of the electronic device 100, which can be generated by an audio module (not shown in FIG. 1) of the electronic device 100. Also, the electronic device 100 may not, in some embodiments, include a button, such as "home button," commonly found in electronic devices, as the protective cover 118 may not include additional openings.

The electronic device 100 can further include a port 126 designed to receive a connector of a cable assembly. The port 126 allows the electronic device 100 to communicate data (send and receive), and also allows the electronic device 100 to receive electrical energy to charge a battery assembly. Accordingly, the port 126 can include terminals that electrically couple to the connector.

Also, the electronic device 100 can include several additional openings. For example, the electronic device 100 can include openings 128 that allow an additional audio module (not shown in FIG. 1) of the electronic device to emit acoustical energy out of the electronic device 100. The electronic device 100 can further include openings 132 that allow an additional microphone of the electronic device to receive acoustical energy. Furthermore, the electronic device 100 can include a first fastener 134 and a second fastener 136 designed to securely engage with a rail that is coupled to the protective cover 118. In this regard, the first fastener 134 and the second fastener 136 are designed to couple the protective cover 118 with the band 102.

The electronic device 100 can include several control inputs designed to facilitate transmission of a command to the electronic device 100. For example, the electronic device 100 can include a first control input 142 and a second control input 144. The aforementioned control inputs can be used to adjust the visual information presented on the display assembly 116 or the volume of acoustical energy output by an audio module, as non-limiting examples. The controls can include one of a switch or a button designed to generate a command or signal that is received by a processor. The control inputs can at least partially extend through openings in the sidewall components. For example, the second sidewall component 106 can include an opening 146 that receives the first control input 142. Further details regarding the features and structure of an electronic device are provided below, with reference to FIG. 2.

Figure 2:
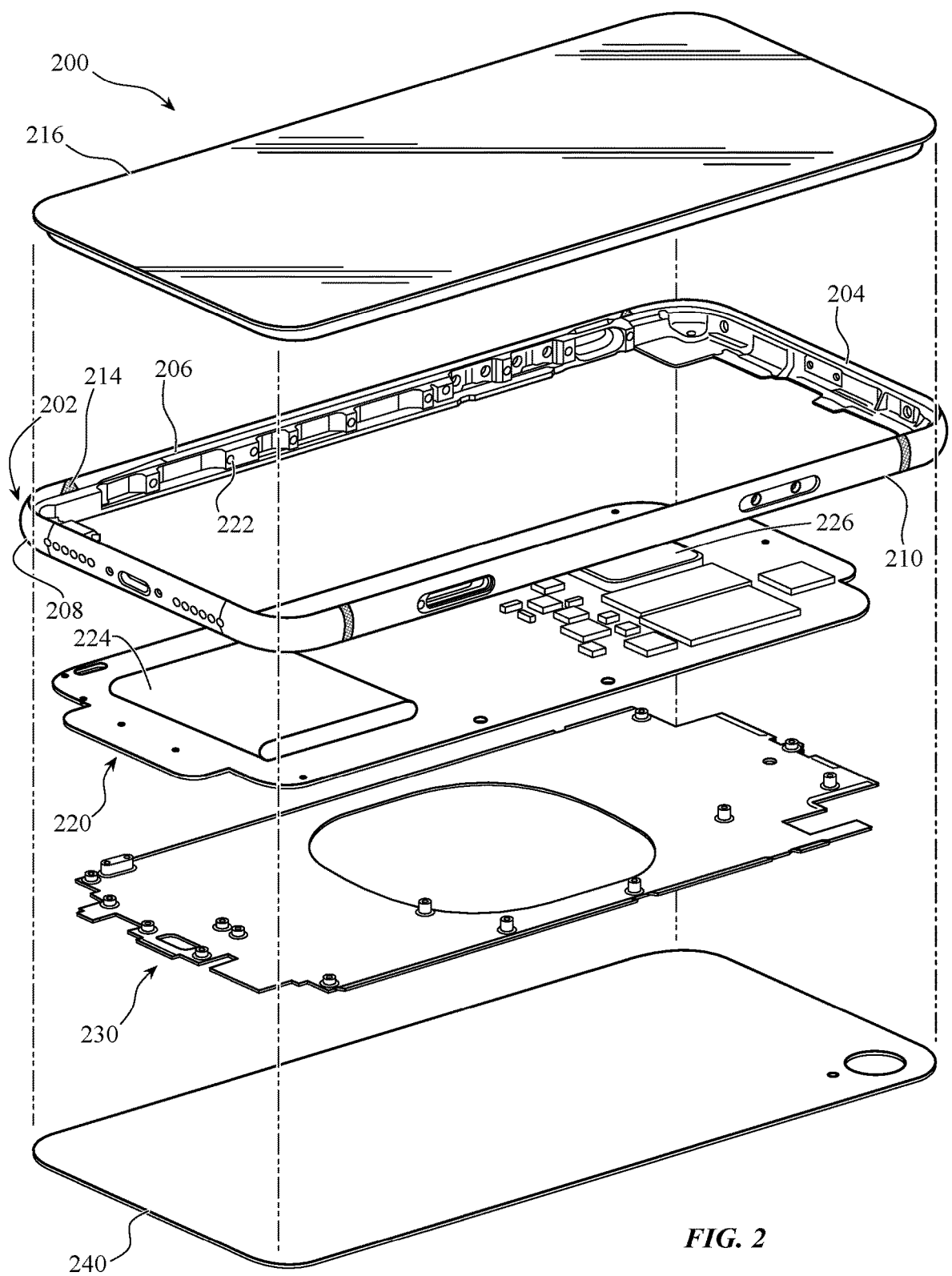
FIG. 2 shows an exploded view of an electronic device.

FIG. 2 illustrates an exploded view of an electronic device 200. The electronic device 200 shown in FIG. 2 is a smartphone, but is merely one representative example of a device that can include or be used with the systems and methods described herein. As described with respect to electronic device 100, electronic device 200 can correspond to any form of wearable electronic device, a portable media player, a media storage device, a portable digital assistant ("PDA"), a tablet computer, a computer, a mobile communication device, a GPS unit, a remote control device, and other similar electronic devices. In some cases, the electronic device 200 can include some or all of the features described herein with respect to electronic device 100.

The electronic device can have a housing that includes a band 202 that at least partially defines an exterior portion, such as an outer perimeter, of the electronic device. As with the band 102 described above in FIG. 1, the band 202 can include several sidewall components, such as a first sidewall component 204, a second sidewall component 206, a third sidewall component 208 (opposite the first sidewall component 204), and a fourth sidewall component 210. The aforementioned sidewall components can be or can include a composite component, as described herein. The band 202 can also include a non-metal material or materials that separate and/or join the sidewall components of the band 202 with each other, as described herein. For example, separating material 214 can separate and/or join the second sidewall component 206 with the third sidewall component 208.

The housing, including the band 202, can include one or more features to receive or couple to other components of the device 200, such as feature 222. For example, the band 202 can include any number of features such as apertures, cavities, indentations, and other mating features to receive and/or attach to one or more components of the device 200. The electronic device 200 can include internal components such as processors, memory, circuit boards, batteries, and sensors. Such components can be disposed within an internal volume defined, at least partially, by the band 202, and can be affixed to the band 202, via internal surfaces, attachment features such as feature 222, threaded connectors, studs, posts, and/or other fixing features, that are formed into, defined by, or otherwise part of the band 202.

The device 200 can include internal components, such as a system in package (SiP) 226, including one or more integrated circuits such as a processors, sensors, and memory. The device 200 can also include a battery 224 housed in the internal volume of the device 200. The device 200 can also include one or more sensors, such as optical or other sensors, that can sense or otherwise detect information regarding the environment exterior to the internal volume of the device 200. Additional components, such as a haptic engine, can also be included in the device 200. The electronic device 200 can also include a display assembly 216, similar to display assembly 116 described herein. In some cases, the display assembly 216 can be received by and/or be attached to the band 202 by one or more attachment features.

The electronic device 200 can further include a chassis 220 that can provide structural support. The chassis 220 can include a rigid material, such as a metal, or can include a composite construction, as described herein. Also, the chassis 220 can be coupled to the band 202. In this manner, the chassis 220 can also provide an electrical grounding path for components electrically coupled to the chassis. The electronic device can alternatively or additionally include a back plate 230 having cladding layers and/or other attachment features such that one or more components of the electronic device 200 can be attached to the back plate 230, for example, via welding. The back plate 230 can form conductive pathways for connecting components of the electronic device 200. In some cases, the back plate 230 can be attached to the band 202 of the device 200 by one or more attachment features, such as feature 222.

An exterior surface of the electronic device 200 can further be defined by a back cover 240 that can be coupled to the band 202. In this regard, the back cover 240 can combine with the band 202 to form an enclosure or housing of the electronic device 200, with the enclosure or housing (including band 202 and back cover 240) at least partially defining an internal volume. The back cover 240 can include a transparent material such as glass, plastic, sapphire, or the like.

The housing, including the band 202 having one or more composite components, as described herein, can be conformed to interior dimensional requirements, as defined by the internal components. For example, the structure of the housing including a composite band 202 can be defined or limited exclusively or primarily by the internal components the housing is designed to accommodate. Since a housing with a composite band 202 can be extremely light and strong, the housing can be shaped to house the interior components in a dimensionally efficient manner without being constrained by factors other than the dimensions of the components, such as the need for additional structural elements. The composite components 204, 206, 208, 210 of the band can be formed by a variety of processes, as discussed herein. In some embodiments, these formation processes can allow for the housing and/or band 202 to have a detailed shape or design that is tailored specifically to satisfy one or more needs, such as internal dimensional requirements, without the need for additional features to reinforce the structure of the housing. Additionally, artifacts of the manufacturing process of the housing can be eliminated.

Additionally or alternatively, other components of the electronic device 200, such as individual internal structural components like the chassis 220 or exterior input components, can be formed from or can include a composite component, as described herein.

While any number or variety of components of an electronic device, such as electronic device 200, can be formed from or can include a composite component, the structure of these composite components can be, for example, a composite component including an exterior portion joined to an interior portion, as described herein. The structure and materials of the exterior and interior portion, as well as the composite component itself, can apply to not only to the specific examples discussed herein, but to any number or variety of embodiments in any combination. Various embodiments of composite components are described below, with reference to FIG. 3.

Figure 3:
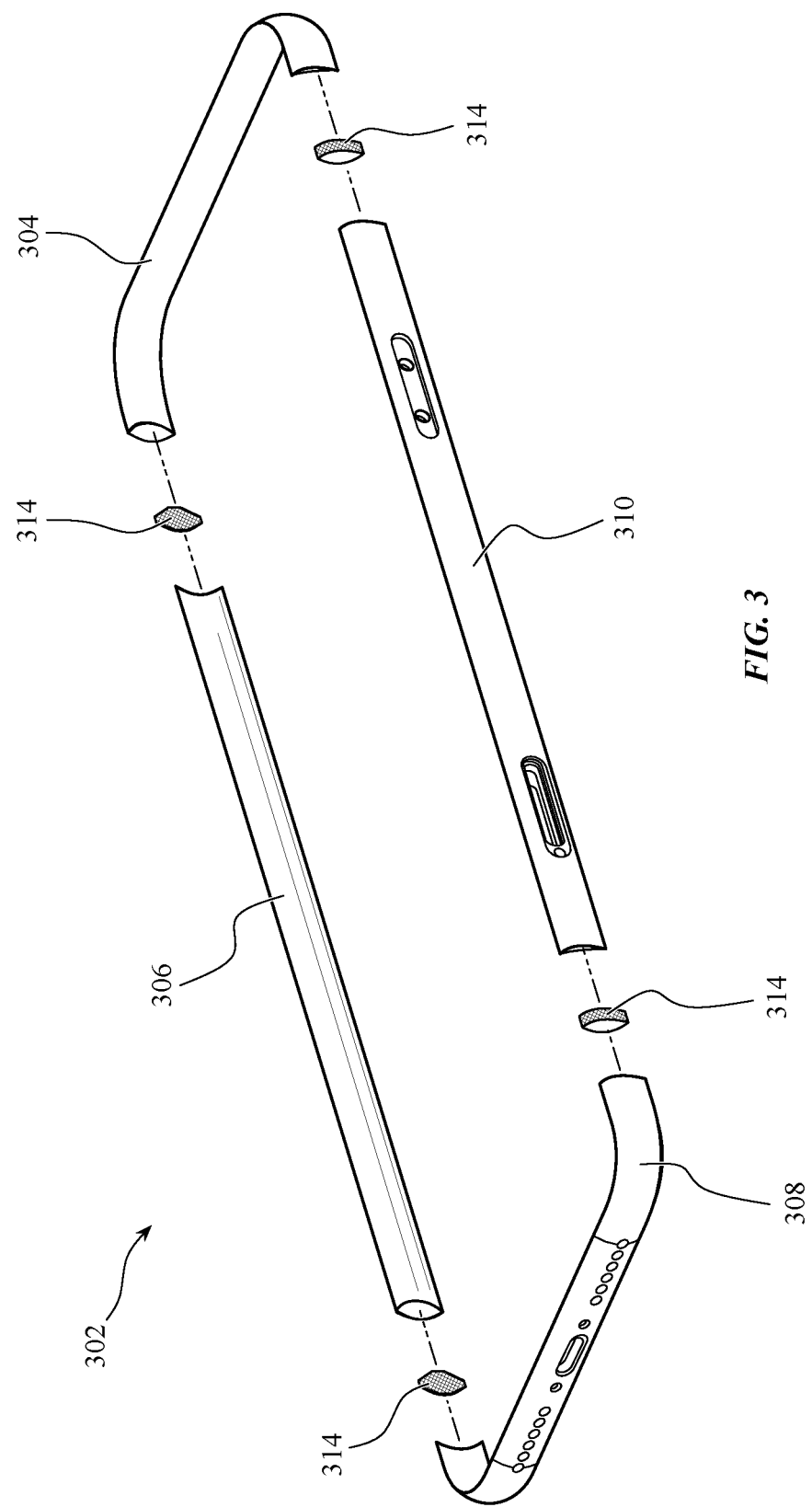
FIG. 3 shows an exploded view of a housing of an electronic device.

FIG. 3 shows an exploded view of a band 302 that can form part of a housing or an enclosure of an electronic device, such as electronic device 100 or electronic device 200 described with respect to FIGS. 1 and 2. The band 302 can include one or more portions that are composite components or that include composite components, such as an exterior portion joined to an interior portion, as described herein. For example, the band 302 can include a first composite sidewall component 304, a second composite sidewall component 306, a third composite sidewall component 308 (opposite the first composite sidewall component 304), and a fourth composite sidewall component 310. In some cases, as described herein, the composite components 304, 306, 308, 310 can be separated and/or joined together by a material that can include an electrically inert or insulating material(s), such as plastics and/or resin, as non-limiting examples.

Although the embodiment illustrated in FIG. 3 includes a band 302 having multiple composite sidewall components 304, 306, 308, 310 that are joined together, in some cases, a housing or enclosure for an electronic device can include or be formed from a single composite component having an interior and exterior portion, as described herein. Further, in some cases, the composite components can form portions of the housing or enclosure other than the sidewalls, such as a top portion, bottom portion, or any portion of the housing or enclosure. Further details of the composite components are provided below with reference to FIGS. 4A-8.

Figure 4A:
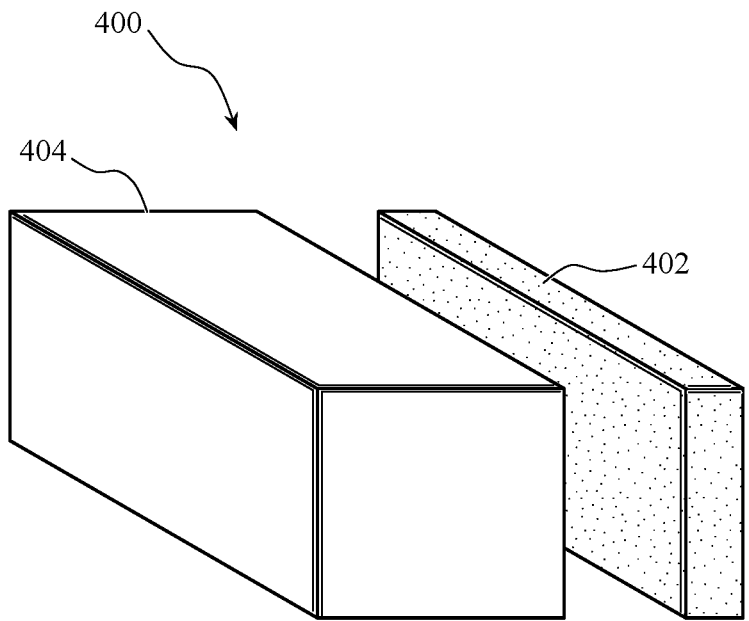
FIG. 4A shows an exploded perspective view of a component of an electronic device.

FIG. 4A shows an exploded perspective view of a composite component 400 including an outer or exterior portion 402 and an inner or interior portion 404. Although illustrated in FIG. 4A as an exploded view, the composite component 400 can include an outer or exterior portion 402 that is joined or bonded to the inner or interior portion 404. In some examples, the exterior portion 402 can be pre-formed and can include a metallic material, such as stainless steel, although other materials are expressly contemplated, as described herein. In some examples, the exterior portion can have a thickness greater than about 25 microns. The interior portion 404 can having a second, different set of material properties that are independent of the first set of material properties of the outer portion 402. In some examples, the exterior portion 402 and the interior portion 404 can be welded, bonded, adhered, or otherwise joined together such that they form the housing, or a portion thereof, and act as a substantially unitary body 400. The exterior portion 402 and the interior portion 404 can include any desired shape or design, and thus, the component 400 can include any desired shape or design. In some examples, the component 400 can be a portion of a housing of an electronic device. In some other embodiments, however, the component 400 can be any component of an electronic device, for example, a structural component, internal component, external component, or other similar component.

Figure 4B:
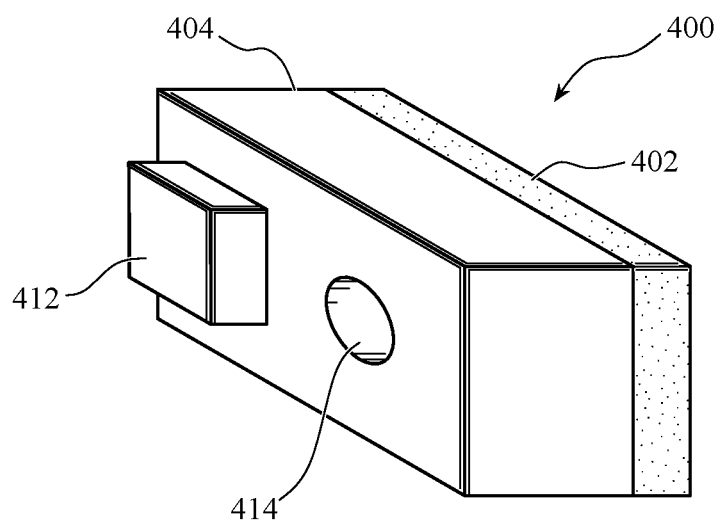
FIG. 4B shows a perspective view of a component of an electronic device.

FIG. 4B shows an assembled perspective view of a composite component 400, for example as shown in FIG. 4A, including features 412 and 414 formed in and at least partially defined by the interior portion 404. As can be seen, the features 412, 414 can include protruding features, recessed features, or combinations thereof. In some examples, a feature, such as feature 412, can be formed by an additive manufacturing process. In some examples, a feature, such as feature 414, can be formed by a subtractive manufacturing process. In some cases, a feature can include an aperture, a recess, a blind hole, a cavity, a protrusion, or combinations thereof. In some examples, a feature 412, 414 can be an attachment feature for one or more other components of an electronic device. The component 400 and concepts illustrated in FIGS. 4A and 4B can be applied to any of the composite components described herein, in any combination. Further examples including the concepts and features discussed with respect to FIGS. 4A and 4B are described below with reference to FIGS. 5-8.

Figure 5:
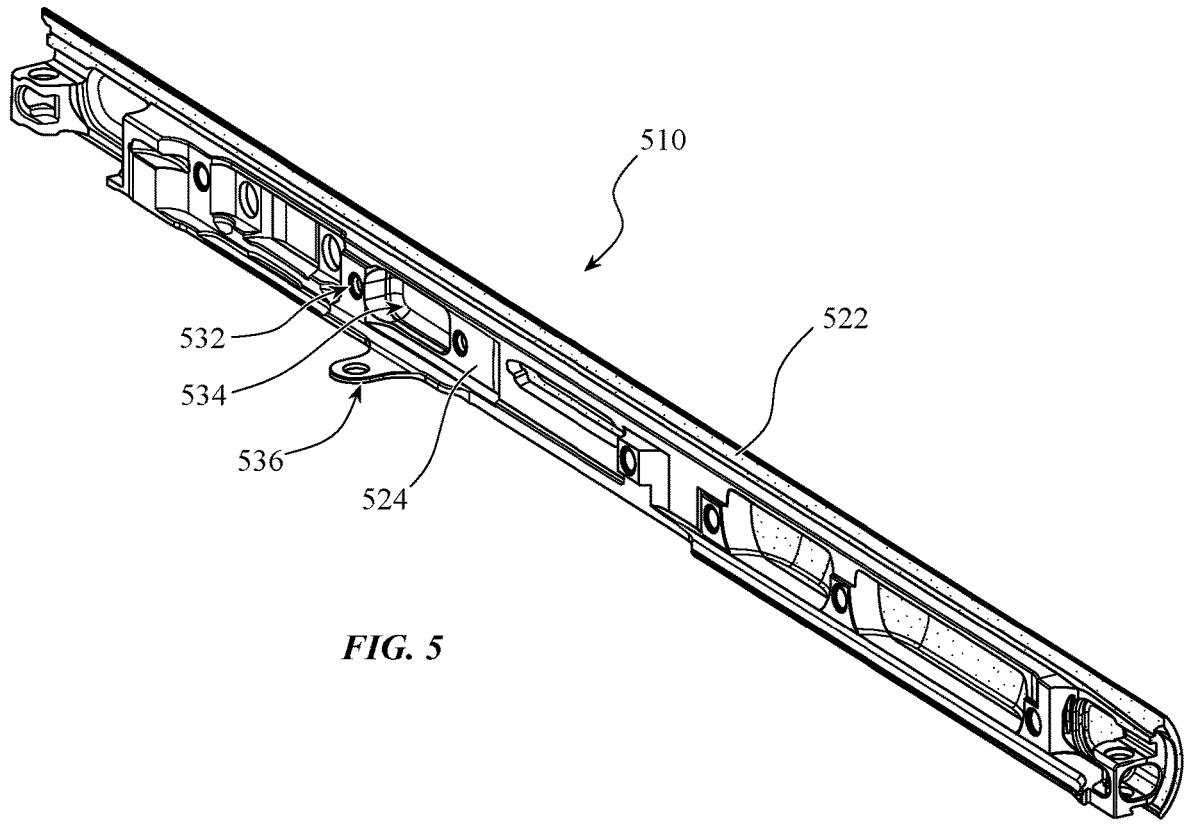
FIG. 5 shows a perspective view of a portion of a housing of an electronic device.

FIG. 5 shows a composite component 510 that can be similar to or include the features of the composite sidewall components 304, 306, 308, 310 described with respect to FIG. 3 and the component 400 described with respect to FIGS. 4A-4B. The composite component 510 can include an outer or exterior portion 522 that is joined to an inner or interior portion 524. In the present example, the exterior portion 522 can at least partially define an exterior surface of a housing or enclosure of an electronic device. The interior portion 524 can at least partially define a surface of an internal volume of the electronic device. As can be seen in FIG. 5, the composite component 510 can include a number of features 532, 534, 536, that can, for example, act as attachment features for other components of an electronic device.

In some cases, the features can be formed in one or both of the exterior portion 522 and the interior portion 524 of the composite component 510. For example, the interior portion 524 of the composite component 510 can include a feature, such as aperture 532. In some cases, the feature 532 can be an aperture, recess, blind hole, or other feature formed in the interior portion 524 by a subtractive process, such as a machining or an etching process. In some examples, the feature 532 can act as an attachment feature for other components of the electronic device. The feature 532 can be configured to receive components of an electronic device, such as buttons or input components. Although depicted as an aperture 532, the feature 532 can take any form or shape, as desired. In some examples, the feature 532 can extend, at least partially, into the interior portion 524 to a desired depth. Alternatively, however, the feature 532 can extend substantially entirely through an entire thickness of interior portion 524.

In some examples, a feature can be formed in both the exterior portion 522 and the interior portion 524 of the composite component 510. For example, feature 534 can be formed in, or defined by, both the exterior and the interior portions 522, 524 of the component 510. Feature 534 can be an aperture or a through hole that passes at least partially through the exterior portion 522 and the interior portion 524. Further, although the portions 522, 524 are illustrated as having a relatively uniform thickness, in some examples the thickness of the exterior portion 522 and/or interior portion 524 can vary at locations where features, such as feature 534, are formed. A protruding feature, such as feature 536, can be formed in the interior portion 524, for example, by a machining process or additive manufacturing process, and can serve as an attachment feature for other components of an electronic device. Although depicted as a protrusion defining an aperture therethrough, the feature 536 can include any shape or design, as desired.

As described herein, the interior portion 524 of the composite component 510 can be selected such that it has a set of material properties that are desirable for the formation of features, such as features 532, 534, 536. For example, the material of the interior portion 524 can be selected to have a material property or set of material properties that allow for the interior portion 524 to be highly machinable without causing high levels of wear on machining tools. Additionally, the material of the interior portion 524 can be relatively inexpensive so that waste material produced by forming the features does not substantially increase production costs. Further, as described herein, the material of the exterior portion can be selected to have a material property or set of material properties, independent of the material properties of the interior portion, that allow the exterior portion 522 to have, for example, high levels of hardness and corrosion resistance.

In some examples, the features formed in one or both of exterior portion 522 and interior portion 524, such as features 532, 534, 536, can have a major dimension from about a micron up to about a millimeter, or several millimeters or more. In some cases, a feature, such as feature 536 can have a major dimension from about 100 microns to about 1 millimeter. Further, in some examples, a feature, such as feature 536, can have minor dimensions from about 100 microns to about 1 millimeter.

Further, as can be seen in FIG. 5, the exterior portion 522 can have a substantially curved shape or profile that can correspond to an exterior profile of the electronic device. The exterior portion 522 can have any shape or profile, as desired. In some examples where the exterior portion has a substantially curved shape or profile, the interior portion 524 can be positioned entirely behind or within a curve defining the curved profile of the exterior portion 522. Additional details of the exterior portion 522 are provided below with reference to FIG. 6.

Figure 6:
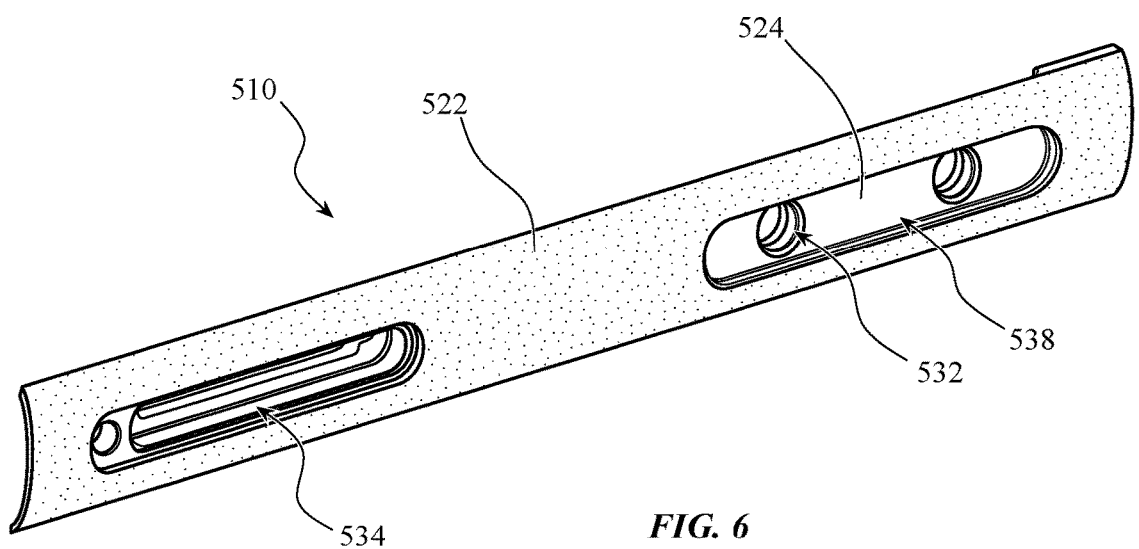
FIG. 6 shows another perspective view of the portion of the housing of FIG. 5.

FIG. 6 shows another perspective view of the composite component 510 of the housing of FIG. 5. As can be seen in FIG. 6, one or more areas, such as area 538, of the exterior portion 522, can be removed so that at least some of the interior portion 524 can be exposed. The exposed surface of the interior portion 522 can be subjected to a treatment or other processing in order to, for example, protect the exposed surface of the interior portion 522. In some examples, the exterior portion 522 can include a stainless steel alloy and the interior portion 524 can include aluminum. At area 538, where the aluminum of the interior portion 524 is externally exposed, an interface between the stainless steel of the exterior portion 522 and the aluminum of the interior portion 524 can also be exposed.

In such cases, the interface between the materials of the two portions can form a galvanic contact and one of the materials of the portions 522, 524 can be subjected or prone to galvanic corrosion. Accordingly, areas, such as area 538, where an interface between the materials of the portions 522, 524 is exposed can be processed or treated to prevent or inhibit galvanic corrosion. A material or materials can be deposited over the interface between the portions 522, 524 at area 538 to prevent or inhibit galvanic corrosion. Example material can include, but are in no way limited to, a polymeric material, a metallic material, a ceramic material, or combinations thereof.

Alternatively, the geometry of the exterior portion 522 and/or interior portion 524 can be designed so that an interface between the portions is not exposed, even when features such as feature 538 are formed in the exterior portion 522. For example, in some cases, the exterior portion 522 can be thicker at the area 538 where a feature is formed so that the interior portion 524 is not exposed, even when material is removed from the exterior portion 524. The interior portion 524 can correspondingly be made thinner at areas where the exterior portion 522 has an increased thickness, so that the composite component 510 maintains a relatively uniform thickness. Alternative views and features of the composite component 510 are detailed below, with reference to FIGS. 7 and 8.

FIG. 7 shows a top view of the composite component 510 depicted in FIGS. 5 and 6. As can be seen, the thicknesses of one or both of the exterior portion 522 and the interior portion 524 can have a thickness that varies along the length of the component 510. Alternatively, however, the thickness of the exterior portion 522 and/or interior portion 524 can be substantially uniform along the length of the component 510. The exterior portion 522 can have a thickness of greater than about 25 microns, greater than about 50 microns, greater than about 100 microns, 200 microns, 300 microns, 400 microns, 500 microns, or greater. In some examples, the exterior portion can have a thickness of up to about 1 millimeter, up to about 2 millimeters, or up to about 5 millimeters or more. In alternative examples, the interior portion 524 can have any desired thickness or thicknesses. For example, as shown in FIG. 7, the interior portion 524 can have a thickness that varies from about 100 microns up to about several millimeters or more. In some instances, the interior portion can have a thickness that approximates an entire width of the electronic device.

FIG. 8 shows a side view of the composite component 510 depicted in FIGS. 5-7. As described herein, the interior portion 524 can include any number of features that are formed in the material or the interior portion 524, or added or attached to the interior portion 524 by any desired method or process. In some cases, the features, such as feature 534, can serve as attachment features for components of an electronic device, such as an internal component or structural components. Further, in some examples, the interior portion 524 can form or define a surface that at least partially defines an internal volume of an electronic device. In some examples, the exterior portion 522 may not form part of a surface that defines an internal volume of an electronic device. In some instances, however, the exterior portion 522 can form at least part of a surface that defines an internal volume of an electronic device.

While any number or variety of components of an electronic device can be formed from or can include a composite component, such as component 210, 310, 400, and/or 510 detailed above, the structure of these composite components typically includes an exterior portion joined to an interior portion, as described herein. The structure and materials of the exterior and interior portions, as well as the composite component itself, can apply not only to the specific examples discussed herein, but also to any number or variety of embodiments in any combination. Various exemplary features of a composite component are described below with reference to FIGS. 9A-11.

Figure 9A:
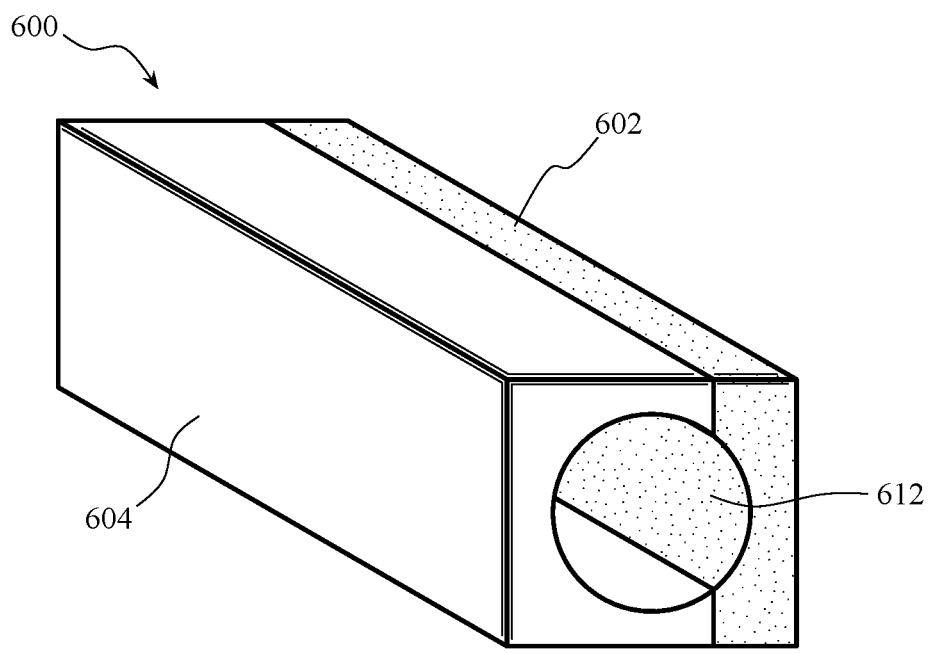
FIG. 9A shows a perspective view of a component of an electronic device.

FIG. 9A shows a perspective view of a composite component 600 including an exterior portion 602 bonded to an interior portion 604, as described herein. In some examples, the exterior portion 602 can include a metal material, although other materials are expressly contemplated, as described herein. The interior portion can include a second material different than the material of the exterior portion, and including a second set of material properties, independent of the set of material properties of the exterior portion 602. As can be seen in FIG. 9A, the exterior portion 602 and the interior portion 604 can cooperate to at least partially define a feature 612. In some examples, the feature 612 can be a recess, an aperture, a cavity, or other similar features, as shown. In some other examples, however, the feature 612 can include a protrusion or positive feature, or combinations thereof. Such a feature 612 can be, in some examples, an attachment feature for joining the component 600 to one or mother other components of an electronic device.

Figure 9B:
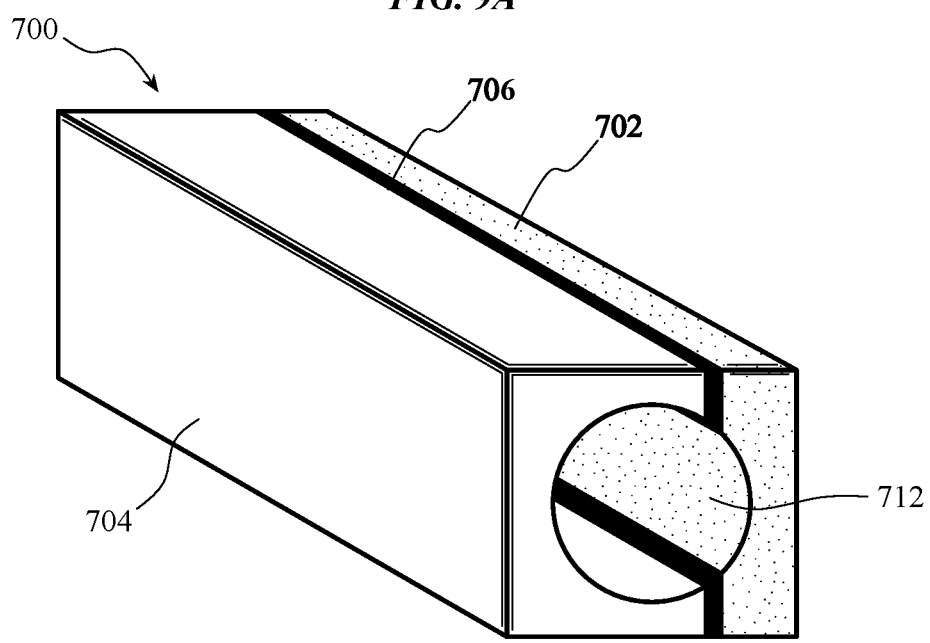
FIG. 9B shows a perspective view of a component of an electronic device.

FIG. 9B shows a perspective simplified view of a composite component 700, including an exterior portion 702 bonded to an interior portion 704, as described herein. As can be seen, the composite component 700 also includes an intermediate layer 706 disposed between the exterior portion 702 and the interior portion 704 that can at least partially bond the portions 702, 704 together. In some examples, the intermediate layer 706 can have any thickness and can be any desired material, such as a polymeric material. In some examples, the intermediate layer 706 can include a heat activated film, an adhesive, a polymer, a resin or epoxy, and the like. In some cases, features, such as feature 712, can be formed in the exterior and/or interior portions 702, 704 prior to joining the portions 702, 704 via the intermediate layer 706. In some other examples, however, the portions 702, 704 can be joined by the intermediate layer 706 and then one or more features, such as feature 712, can be formed in the component 700.

The components 600 and 700 and concepts illustrated in FIGS. 9A and 9B can be applied to any of the composite components described herein, in any combination. Further cases including the concepts and features discussed with respect to FIGS. 9A and 9B are described below, with reference to FIGS. 10-11.

Figure 10:
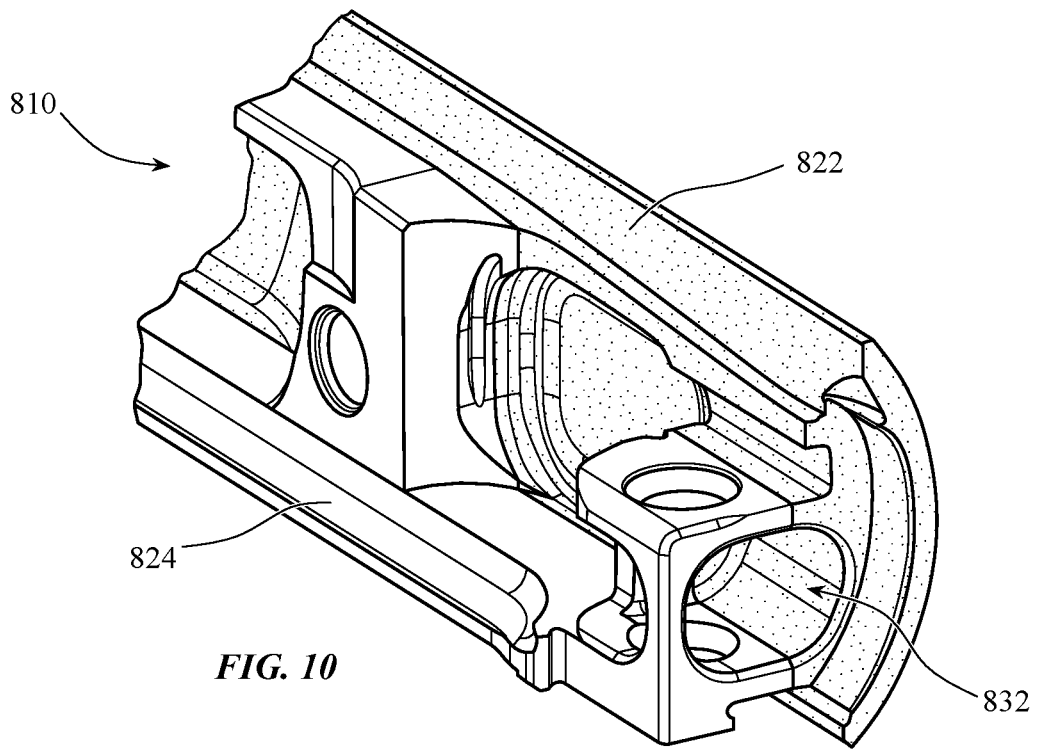
FIG. 10 shows a close-up perspective view of a portion of a housing of an electronic device.

FIG. 10 shows a close-up perspective view of a composite component 810 that can form a part of a housing or an enclosure of an electronic device. As with component 510 depicted in FIGS. 5-8, the component 810 can include a pre-formed exterior portion 822 that is joined to an interior portion 824. The exterior portion 822 can include a material or materials having a first set of material properties, while the interior portion 824 can include a material or materials having a second set of material properties independent of the first set of material properties.

As described herein, in some examples, the exterior portion 822 can be directly joined, bonded, or adhered to the interior portion 824. That is, the exterior portion 822 can directly contact, abut, be fused to, bonded to, or otherwise joined to the interior portion 824. In some examples where the exterior portion 822 and interior portion 824 both include metal materials, the bond between the exterior and interior portions 822, 824 can be a metallurgical bond. In some examples, the exterior portion 822 can directly contact the interior portion 824 along substantially the entire interface, or only at one or more locations. Further, in some embodiments, even where the portions 822, 824 are in direct contact along substantially the entire interface, the portions 822, 824 can be bonded or joined together at only one or more locations. For example, the interior portion 824 can, in some embodiments, be welded to the exterior portion 822 at one or more locations.

The interior portion 824 can be joined to the exterior portion 822 by any number of processes such as brazing, diffusion bonding, electron beam welding, ultrasonic welding, laser welding, and other joining methods. In some examples, the portions 822, 824 can be welded together by a pulsed laser welding process, such as a nanosecond pulsed laser welding process. In examples where a welding process is used, the welding process can be conducted along the interface or seam between the portions 822, 824, or can be conducted through one or both of the portions 822, 824 at any number of desired locations.

As can be further seen in FIG. 10, the composite component 810 can include one or more features, such as feature 832, that are formed from or defined by both the exterior portion 822 and interior portion 824. In some instances, feature 832 can be an attachment feature, for example for one or more components of an electronic device. Feature 832 can also serve alternative or additional purposes and can, for example, serve to reduce the weight of the composite component 810. In some examples, a feature 832 can facilitate the joining of the composite component 810 to another composite component to form a housing or an enclosure, such as band 102 or 202, as described herein. In some examples, feature 832 can mechanically engage with a material, such as material 114, 214, 314 described herein, to form a band 102, 202.

While any number or variety of components of an electronic device can be formed from or can include a composite component, such as component 210, 310, 400, 510, 600, and/or 810, the structure of these composite components can be, for example, a composite component including an exterior portion joined to an interior portion, as described herein. The structure and materials of the exterior and interior portion, as well as the composite component itself, can apply not only to the specific examples discussed herein, but to any number or variety of embodiments in any combination. Various embodiments of composite components are described below with reference to FIG. 11.

Figure 11:
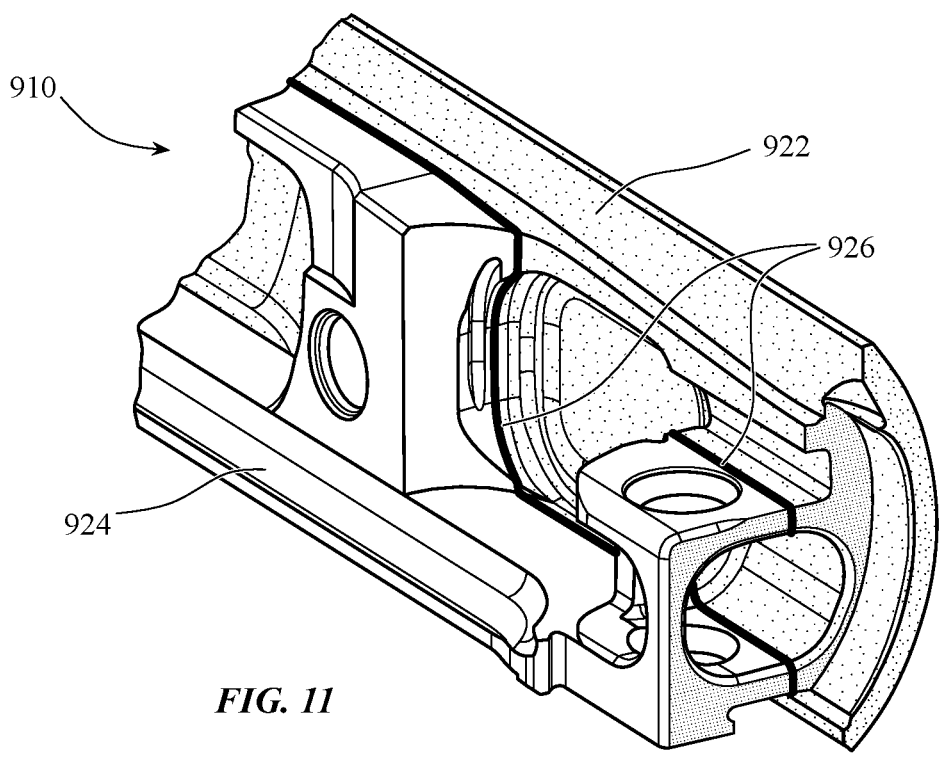
FIG. 11 shows a close-up perspective view of a portion of a housing of an electronic device.

FIG. 11 shows an exemplary composite component 910 that can include a pre-formed exterior portion 922 joined to an interior portion 924 by an intermediate layer 926. The intermediate layer 926 can include any desired material, such as a polymeric material, ceramic material, metallic material, or combinations thereof. In some examples, the intermediate layer 926 can include a heat activated film, an adhesive material, an injection molded material such as an injection molded metal or polymer material, and similar joining materials. In some examples, the intermediate layer 926 can include a resin or epoxy that can be cured to bond the exterior portion 922 to the interior portion 924. The intermediate layer can also include a moldable material, such as a polymeric material, that can be provided between the portions 922, 924 in a moldable form and cured or cooled to thereby bond the portions 922, 924 together.

The intermediate layer 926 can have any desired thickness. In some examples, the intermediate layer can have a thickness up to about 1 micron or smaller, about 5 microns, about 10 microns, about 50 microns, about 100 microns, about 200 microns, about 300 microns, about 500 microns, about 0.1 millimeters, about 0.5 millimeters, about 1 millimeter, about 2 millimeters, or about 5 millimeters or more. In some examples, one or more surfaces of the exterior portion 922 and/or interior portion 924 can include features that can mechanically engage with the intermediate layer 926, for example, to bond the portions together. For example, a surface of the exterior portion 922 and/or interior portion 924 can include nano-scale, micro-scale, or macro-scale features that mechanically engage with the intermediate layer 926. These features can be formed by treating a surface of the portion 922, 924, for example, by machining, etching, and similar surface treatments.

In some examples, as discussed herein, where the exterior portion 922 and the interior portion 924 can include materials that can be susceptible to galvanic corrosion, such as steel and aluminum, an intermediate layer 926 can serve to inhibit or prevent such corrosion, for example, by preventing the direct contact of the portions 922, 924 in at least some locations. In some examples, the intermediate layer 926 can be present at or along an entire interface between the exterior portion 922 and the interior portion 924. In other examples, however, the intermediate layer 926 may only be present at one or more locations between the portions 922, 924, such as, at locations where the interface between the exterior portion 922 and the interior portion 924 is exposed to, or can be exposed to an external environment.

The exterior portion 922 and interior portion 924 of a composite component 910 including an intermediate layer 926 can additionally or alternatively be joined or bonded by other methods as described herein. For example, the exterior portion 922 can be joined with the interior portion 924 by mechanical engagement with the intermediate layer 926 at one or more locations and by welding at one or more other locations.

While any number or variety of components of an electronic device can be formed from or can include a composite component, such as component 210, 310, 400, 510, and/or 810, the structure of these composite components can be a composite component including an exterior portion joined to an interior portion, as described herein. The structure and materials of the exterior and interior portion, as well as the composite component itself can apply not only to the specific examples discussed herein, but to any number or variety of embodiments in any combination. Various embodiments of composite components are described below with reference to FIGS. 12-14.

Figure 12A:
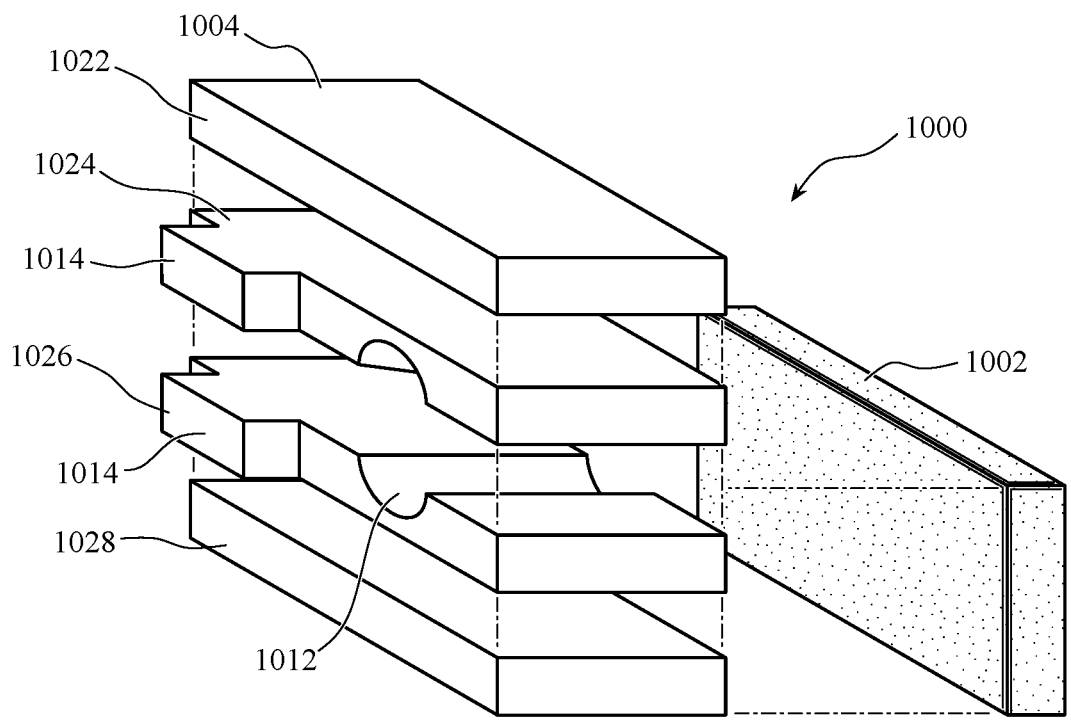
FIG. 12A shows an exploded perspective view of a component of an electronic device.

FIG. 12A shows an exploded simplified view of a composite component 1000 including an exterior portion 1002 and an interior portion 1004. As described herein, the exterior portion can include a first material, such as a metal, and can be pre-formed. The interior portion 1004 can at least partially define a feature or features 1012, 1014 and, as illustrated, can include two or more layers 1022, 1024. 1026, 1028. In some examples, these layers 1022-1028 can include or be formed from a single material, which can include any of the materials described herein as forming the interior portion generally. Alternatively, however, one or more of the layers 1022-1028 can include a different material than another layer. For example, layer 1022 can include a second material that is different than the first material of the exterior portion 1002, while layer 1024 can include a third material that is different than the first material of the exterior portion 1002 and the second material of layer 1022. The layers 1022-1028 of the interior portion 1004 can be bonded to one another by any of the methods described herein with respect to bonding portions together, for example, welding, brazing, diffusion bonding, adhesives, mechanical engagement, and other similar bonding or joining methodologies. Although depicted in a substantially horizontal stack, the layers 1022-1028 can be arranged to form the interior portion 1004 in any desired manner. For example, the layers can be stacked vertically, horizontally, or any angle in between.

Figure 12B:
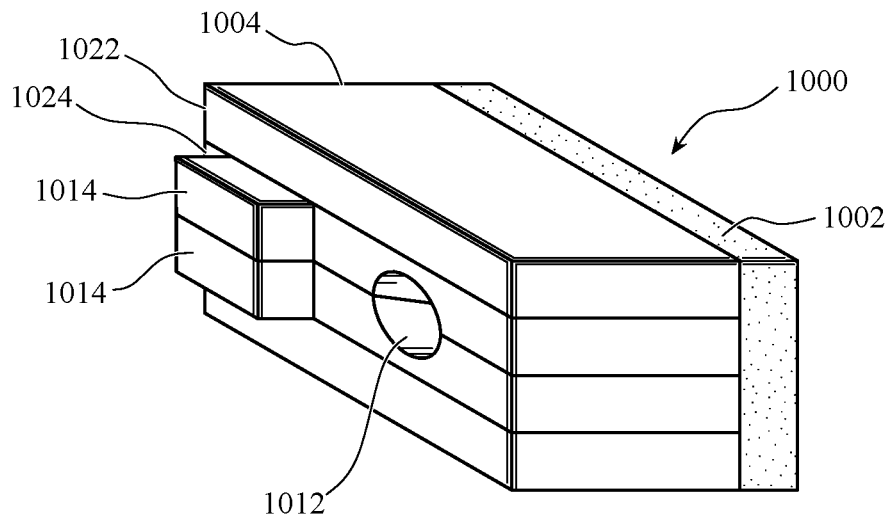
FIG. 12B shows a perspective view of a component of an electronic device.

As can be seen in FIG. 12B, the layers 1022-1028 can cooperate to form and define the interior portion 1004 of the component 1000. Further, two or more layers 1024, 1026 can cooperate to form or define one or more features 1012, 1014. In some examples, the feature 1012 can be a recess, aperture, cavity, or the like as shown. In some other examples, however, the feature 1014 can include a protrusion or positive feature, or combinations thereof. Such a features 1012, 1014 can be an attachment feature for joining the component 1000 to one or more other components of an electronic device. In some examples, the layers 1022-1028 can be shaped or formed into a desired shape prior to being bonded together to define the features 1012, 1014. In some other cases, however, the layers 1022-1028 can be bonded or joined together and can then be subjected to additive or subtractive processing to form one or more features 1012, 1014 therein.

The component 1000 and concepts illustrated in FIGS. 12A and 12B can be applied to any of the composite components described herein, in any combination. Further examples including the concepts and features discussed with respect to FIGS. 12A and 12B are described below with reference to FIGS. 13 and 14.

Figure 13:
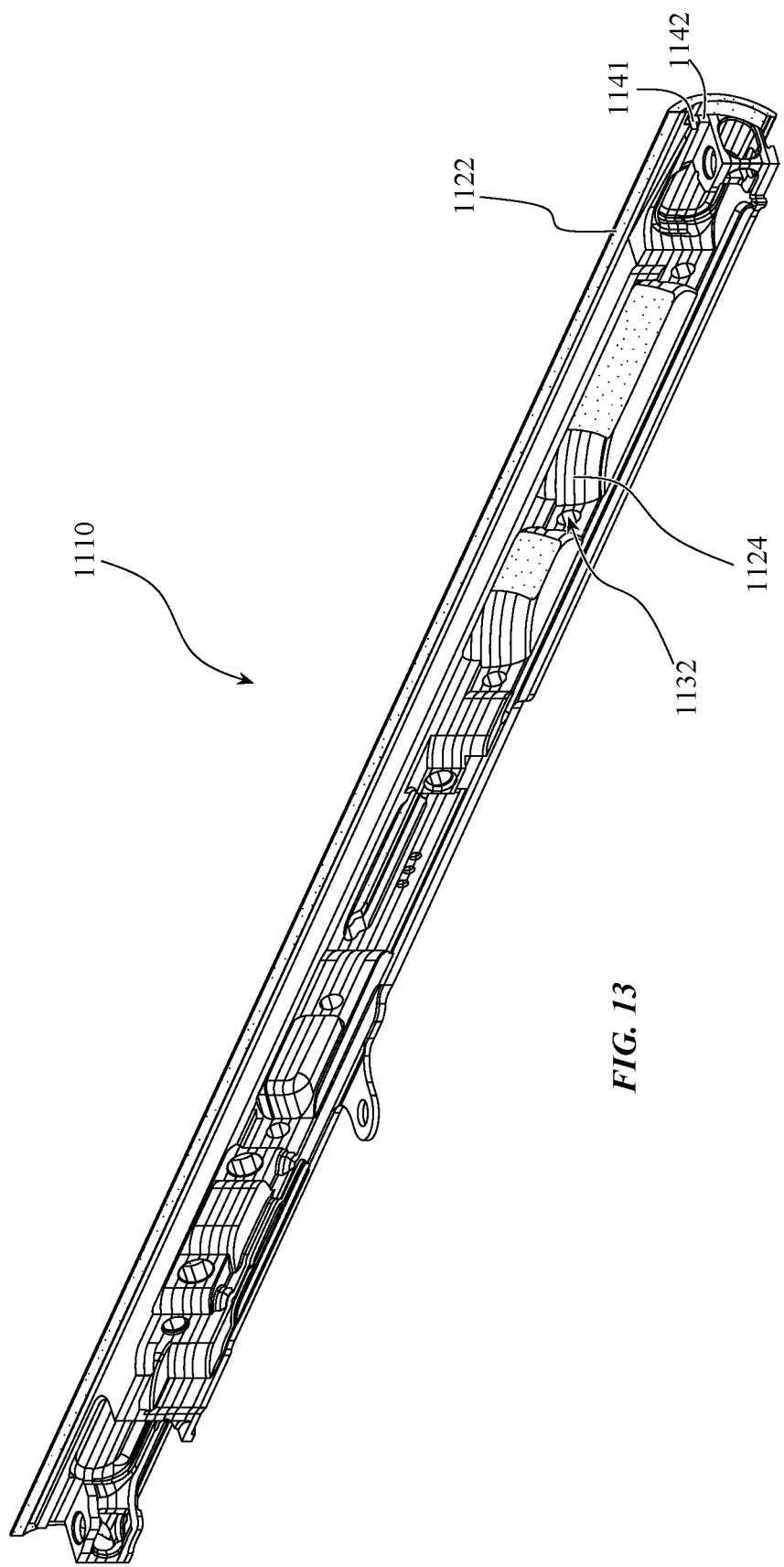
FIG. 13 shows a perspective view of a portion of a housing of an electronic device.

FIG. 13 illustrates a composite component 1110 that can be or form part of an enclosure or housing, such as band 102, 202 described herein. The composite component 1110 can include an outer or exterior portion 1122 that is joined to an inner or interior portion 1124, as described herein. The exterior portion 1122 can at least partially define an exterior surface of a housing or an enclosure of an electronic device. In the present example, the interior portion 1124 can at least partially define a surface that defines an internal volume of the electronic device and can include or be formed from one or more layers 1141, 1142.

As can be seen in FIG. 13, the interior portion 1124 having two or more layers 1141, 1142 can include features, such as feature 1132, which can serve as attachment features for other components of an electronic device. As illustrated in FIG. 13, two or more layers 1141, 1142 can cooperate to form features in the interior portion 1124, such as feature 1132. In some examples, a feature 1132 can be formed in the interior portion 1124 subsequent to joining two or more layers 1141, 1142 together, for example, by machining. Alternatively, layers 1141, 1142 can be shaped prior to joining, so as to define a feature 1132 upon being joined. In those cases where layers 1141, 1142 can be shaped prior to joining to form a feature 1132, the interior portion 1124 and/or feature 1132 can be subjected to treatment or processing to further define the shape of the feature. Further details of how multiple layers may be joined to form the interior portion 1124 and provided below with reference to FIG. 11.

Figure 14:
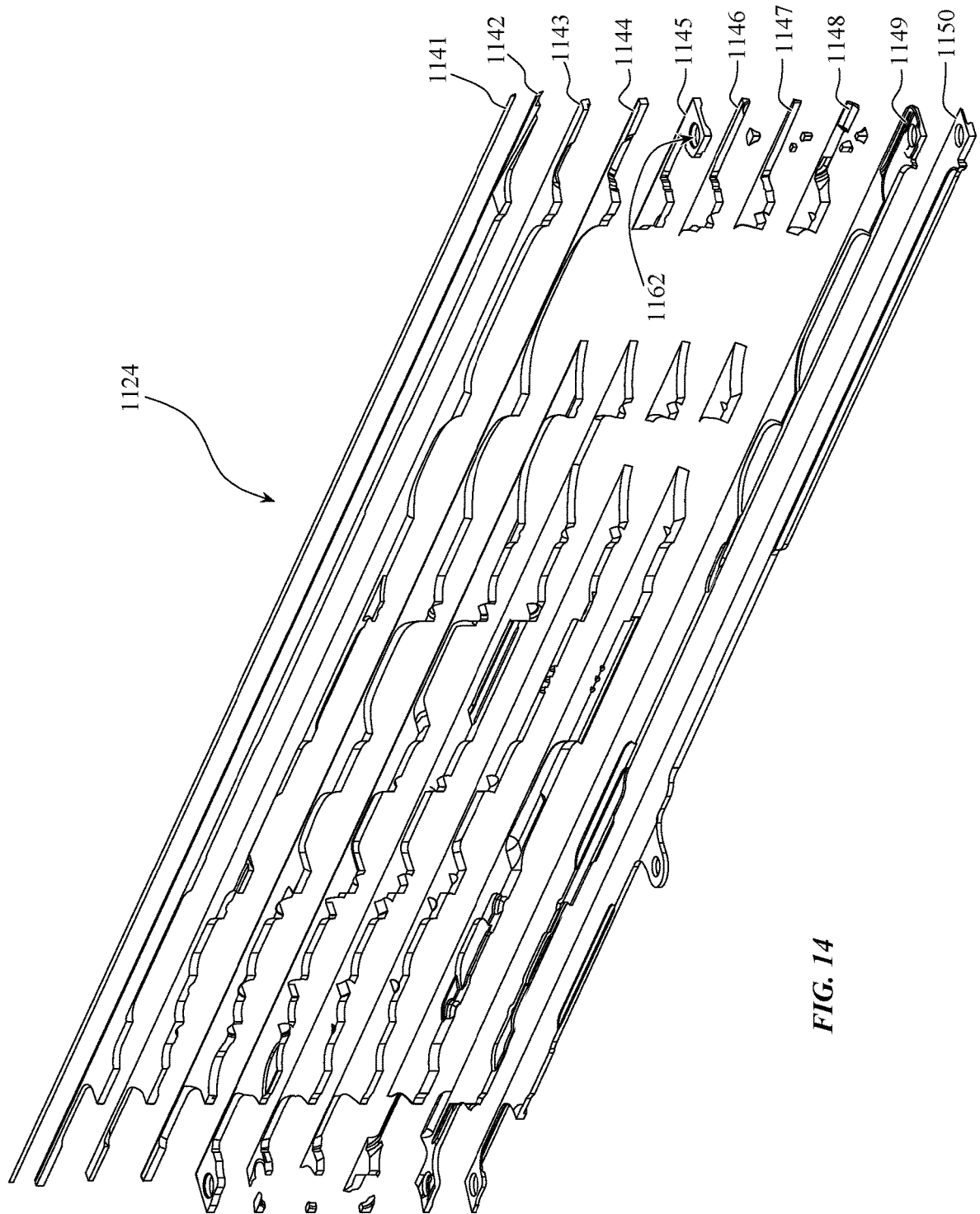
FIG. 14 shows an exploded view of the portion of the housing of FIG. 13.

Turning now to FIG. 14, an exploded view of interior portion 1124 including the layers 1141, 1142, 1143, 1144, 1145, 1146, 1147, 1148, 1149, and 1150 that make up the portion 1124 is illustrated. In some examples, the layers 1141-1150 can include or be formed from a single material, which can include any of the materials described herein as forming the interior portion generally. Alternatively, however, one or more of the layers 1141-1150 can include a different material than the other layers 1141-1150. For example, layers 1141, 1143, 1145, 1147, 1149 can include a first material, such as a metallic material, while layers 1142, 1144, 1146, 1148, 1150 can include a second, different material, such as a polymeric material. Other configurations of layers and materials are expressly contemplated. The layers 1141-1150 can be joined or bonded to one another by any method or process described herein in the context of joining an exterior portion to an interior portion to form a substantially unitary interior portion 1124. For example, a layer 1141 can be directly welded to an adjacent layer 1142, or the layers 1141, 1142 can be joined together by an intermediate material, such as an adhesive or heat activated film.

In some examples, one or more of the layers 1141-1150 can be formed into a desired shape or design prior to being joined to another layer, to form the interior portion 1124. For example, a layer 1144 can include a metallic material, such as aluminum, and can be formed by stamping a sheet of aluminum having the desired layer thickness. This stamped layer 1144 can then be joined or bonded to one or more adjacent layers, 1143, 1145 to form the interior portion 1124. As described above with respect to FIG. 13, the layers 1141-1150 can cooperate to form or define a feature 1132. Alternatively, a feature 1162 can be formed in or defined by an individual layer, such as layer 1145.

One or more of layers 1141-1150 can be substantially continuous or unitary. In some instances, however, one or more of layers 1141-1150, such as layer 1145, may not be continuous and can include two or more disconnected or discontinuous parts or pieces. In some instances, an underlying layer, such as layer 1146 can serve to hold or maintain the parts or pieces of discontinuous layer 1145 in a desired position or orientation.

One or more of layers 1141-1150 can have substantially the same thickness or height as one or more other layers of layers 1141-1150. In some examples, however, one or more of the layers 1141-1150 can have a different thickness than one or more other layers 1141-1150. Each layer 1141-1150 can have any desired thickness, for example, up to about 10 microns, about 25 microns, about 50 microns, about 100 microns, about 200 microns, about 300 microns, about 400 microns, about 500 microns, or greater. In some examples, a layer 1141-1150 can have a thickness of about 1 millimeter, about 2 millimeters, or greater.

Although the layers 1141-1150 are illustrated in an orientation where the width of an individual layer substantially corresponds to a width of the interior portion 1124 while the thickness of an individual layer makes up only a fraction of the height of the interior portion 1124, in some cases, the layers 1141-1150 can be disposed, shaped, or joined in any number of orientations. For example, the height of an individual layer can substantially correspond to a height of the interior portion 1124 while the width of an individual layer can make up only a fraction of the width of the interior portion 1124. Alternatively, the layers 1141-1150 can be shaped and/or joined such that a width, height, and/or length of a layer can make up only a fraction of the width, height, and/or length of the interior portion 1124.

While any number or variety of components of an electronic device can be formed from or can include a composite component, such as component 210, 310, 400, 510, 600, 700, 810, 910, and/or 1110, the structure of these composite components can include an exterior portion joined to an interior portion, as described herein. The structure and materials of the exterior and interior portion, as well as the composite component itself, can apply not only to the specific examples discussed herein, but to any number or variety of embodiments in any combination. Various embodiments relating to methods and processes for forming the presently described structures are described below with reference to FIGS. 15-18.

Figure 15:
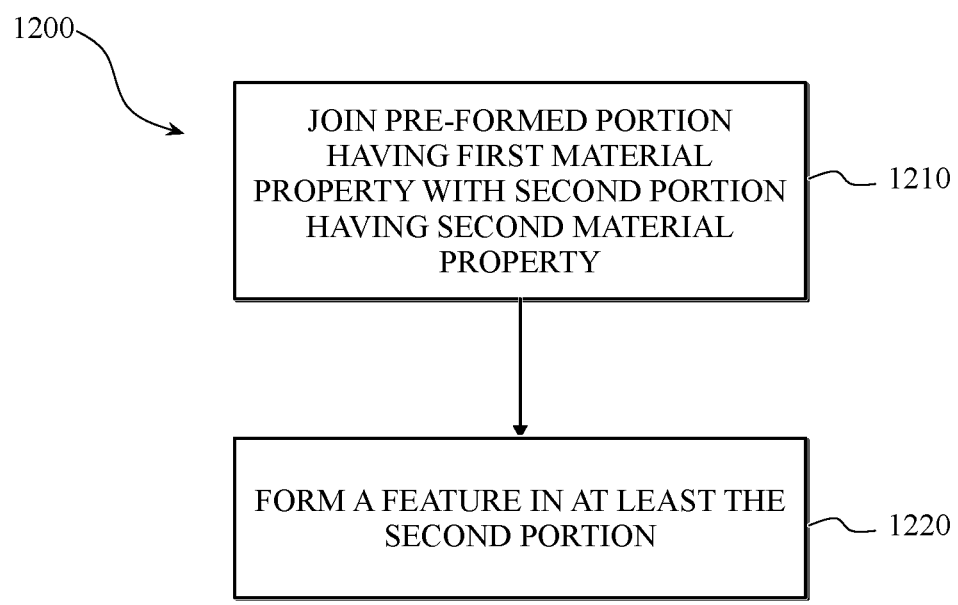
FIG. 15 shows a process flow diagram of a method for forming a component of an electronic device.

FIG. 15 illustrates a process flow diagram of an exemplary process for forming a composite component, as described herein. The process 1200 for forming the composite component can include joining a pre-formed portion, such as an exterior portion as described herein, including a first material having a first material property or set of material properties, with a second portion, such as an interior portion as described herein, including a second material having a second material property or set of material properties, at block 1210. Once joined, the process continues by forming one or more features in at least the second portion, at block 1220.

At block 1210, a pre-formed first portion, can be joined with a second portion. The pre-formed first portion can include a first material, while the second portion can include a second material that can be independently selected. The materials of the first and second portions can include any of the materials described herein with respect to interior and/or exterior portions of a composite component. In some examples, the pre-formed first portion can be subject to treatment or processing prior to joining, for example, to form a desired profile or shape, or to form one or more features therein.

In some examples, the pre-formed first portion can be positioned or held in a desired position, for example by a clamping device or other apparatus, and the second portion can be brought into contact with the pre-formed first portion, whereupon the portions are joined together to form a substantially unitary body. The particular process used to join the portions can include any of the processes discussed herein and can be selected depending on the materials of the pre-formed first portion and the second portion. For example, joining can include directly joining the pre-formed first portion with the second portion via processes such as welding, for example ultrasonic welding or laser welding, brazing, diffusion bonding, fusing, or other similar methods. In some examples, joining can include pulsed laser welding, for example nanosecond pulsed laser welding. Alternatively, joining can include mechanically engaging a feature of the pre-formed first portion with a corresponding feature of the second portion, as described herein.

In some examples, joining can alternatively or additionally include providing a layer or material between the pre-formed first portion and the second portion to join the portions together. Thus, in some examples, joining can include providing a material such as an adhesive, a glue, a heat activated film, a polymer material such as epoxy or resin, or another moldable material between the pre-formed first portion and the second portion. This intermediate layer can be provided as a moldable material between the portions, in at least some locations, and cured or cooled to join the portions. In some instances, the intermediate material can form a direct bond with the surface of one or both portions, such as a chemical or metallurgical bond. In some examples, the intermediate material can join the portions by alternatively or additionally mechanically engaging with one or more features on a surface of the portions.

In some examples, the second portion can be joined with the pre-formed first portion by providing the second portion to the pre-formed first portion in a moldable form and curing, cooling, or otherwise hardening the material of the second portion. For example, the second portion can be cast, die cast, molded, injection molded, metal injection molded, or otherwise formed into a feature or features of the pre-formed first portion. In some examples, the pre-formed first portion can be present in a mold or other apparatus and the second portion can be provided into the mold to solidify and join with the pre-formed first portion.

In some examples, providing the second portion in moldable form can join the pre-formed first portion and second portion by forming a bond directly between the materials of the first and second portions, such as a chemical or a metallurgical bond. The portions can alternatively or additionally be joined by mechanical engagement between the material of the second portion with one or more features formed in or on a surface of the first portion, such as nano-, micro-, and/or macro-scaled features. Thus, in some examples, material of the second portion can flow or otherwise be provided into one or more receiving features of the pre-formed first portion and solidify to thereby mechanically engage with and join the portions.

Further, the first portion, although described as a preformed first portion, can be formed substantially simultaneously with the second portion. For example, in some cases, the first and second portions can be co-extruded or can both be provided in moldable form so that the portions are joined by a chemical bond, a metallurgical bond, a mechanical engagement, other joining functionalities, or combinations thereof.

At block 1220, one or more features are formed in at least the second portion of the composite component. The feature or features can be formed according to any of the processes or methods described herein, such as additive or subtractive manufacturing processes. For example, one or more features can be formed in at least the second portion by machining, etching, depositing, molding, or other processes. Alternatively, the one or more features can be formed in both the pre-formed first portion and the second portion, for example, as described herein.

Forming one or more features in at least the second component at block 1220 can occur substantially simultaneously with the joining step at block 1210. For example, in some cases where the second portion can be cast or molded into the pre-formed first portion, the one or more features can be formed in the second portion during the molding or casting process when the second portion is solidified or otherwise formed and joined with the first portion. The formed composite component can be subjected to further processing and treatment, as described herein. For example, an exterior surface of the pre-formed first portion can be treated, for example by depositing a PVD layer thereon, to provide a desired color or surface finish.

Figure 16:
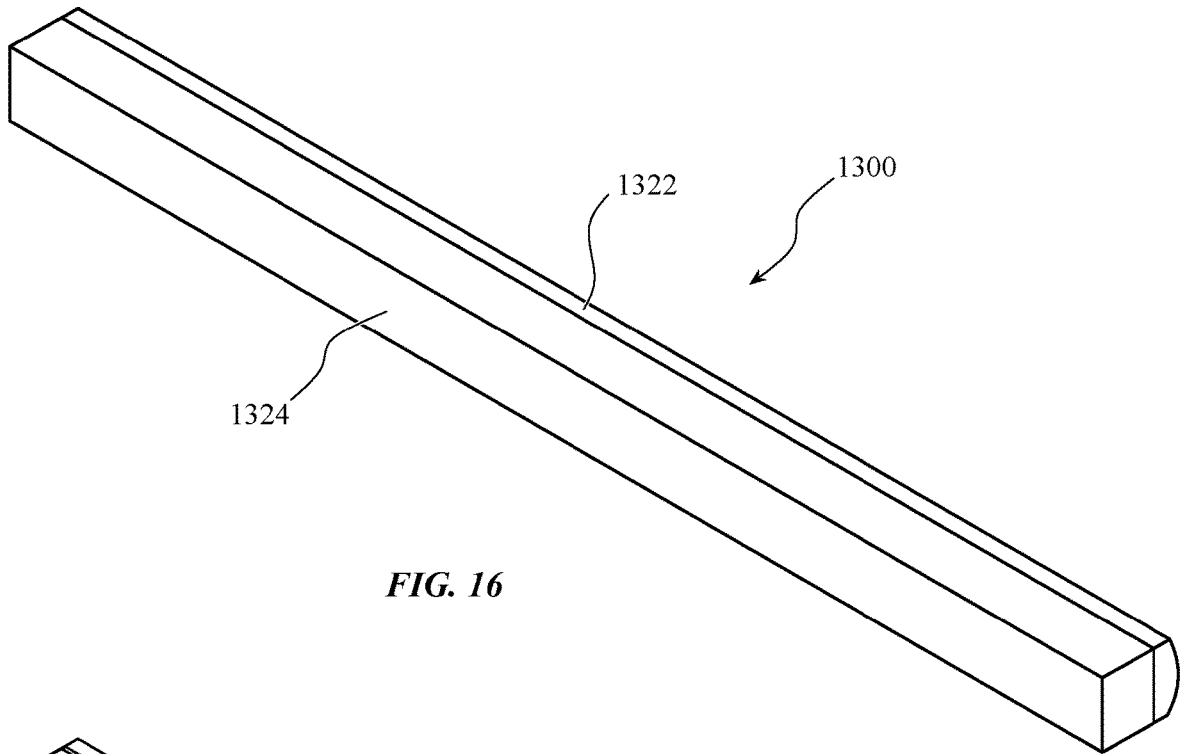
FIG. 16 shows a perspective view of a unitary body including a first material and a second material.
Figure 17:
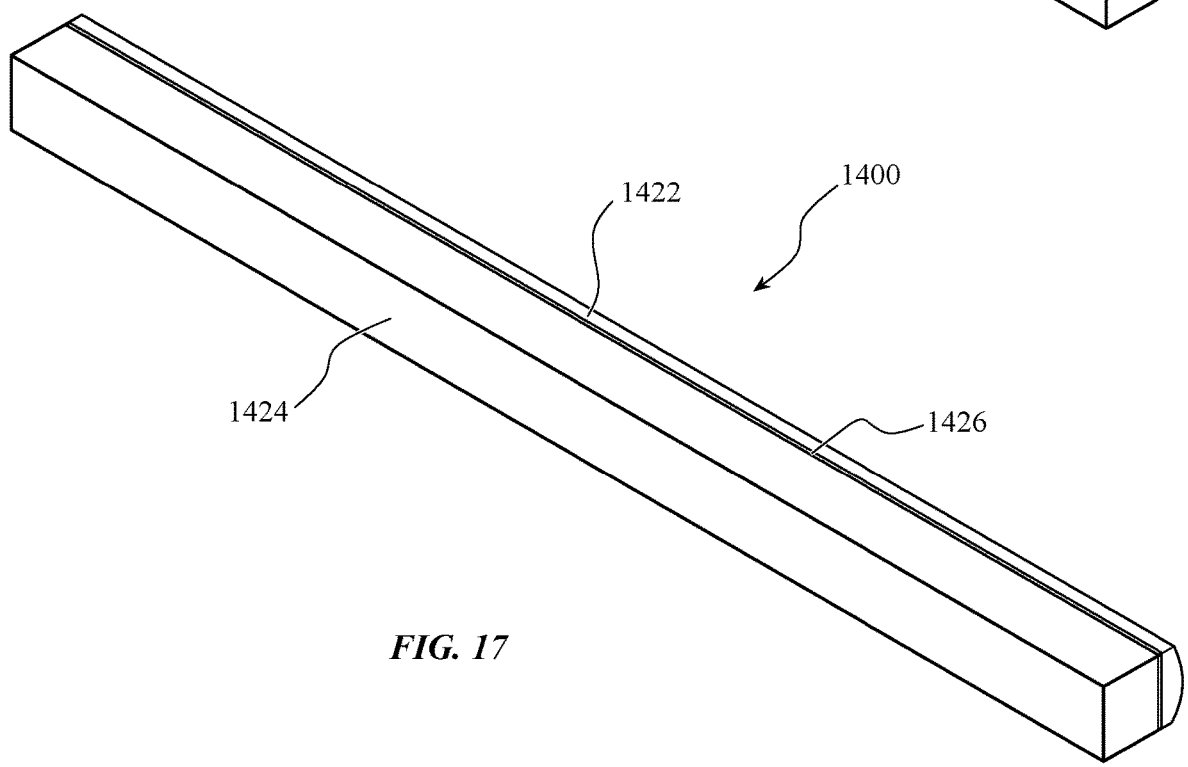
FIG. 17 shows a perspective view of a unitary body including a first material and a second material.

FIGS. 16 and 17 illustrate examples of a unitary body 1300, 1400 including a pre-formed first portion 1322, 1422 joined with a second portion 1324, 1424, as described above with respect to method 1200. As can be seen in FIG. 16, the pre-formed first portion 1322 can be directly joined with the second portion. Further, in some cases, the pre-formed first portion can have a non-rectangular profile and can have, for example, a curved profile corresponding substantially to a desired final profile of the composite component. As shown in FIG. 17, an intermediate layer 1426 can be present between the pre-formed first portion 1022 and the second portion 1424, as described herein.

The unitary bodies 1300, 1400 illustrated in FIGS. 16 and 17 have not yet had any features formed thereon, as detailed in block 1220. In some examples, the unitary bodies 1300, 1400 can be processed in an essentially similar manner and by essentially similar equipment and apparatuses as a unitary piece of material to form a composite component. For example, the composite unitary body 1300, 1400 can be machined by a machining apparatus that can generally be used to machine parts out of a body of a single material.

Figure 18:
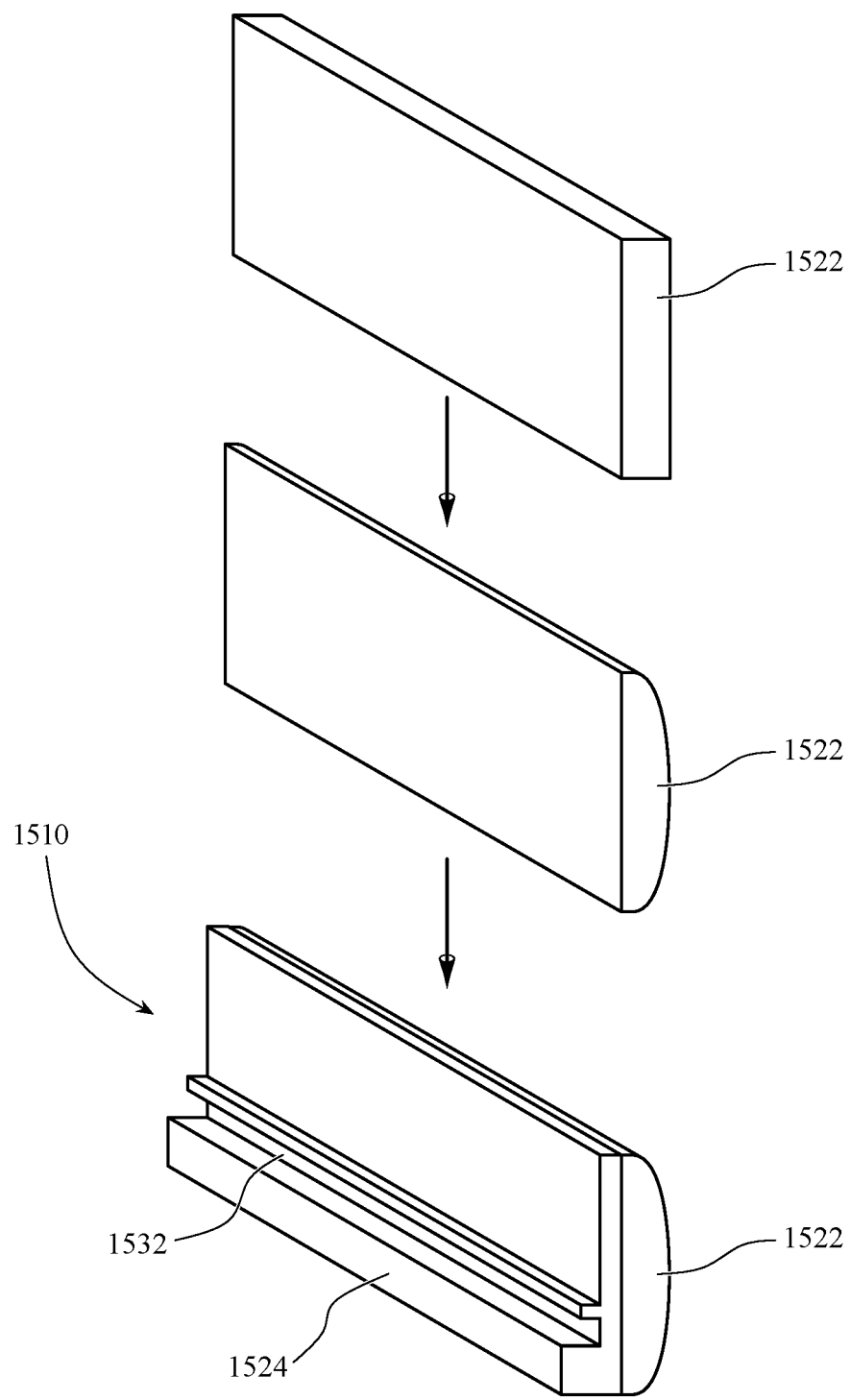
FIG. 18 shows a schematic diagram of stages of a method for forming a component of an electronic device.

FIG. 18 illustrates a schematic diagram depicting process steps for the method 1200 described above, including die casting the second portion 1524 onto the pre-formed first portion 1522. Pre-formed first portion 1522 can be initially provided or formed in any general shape or configuration. As described above, the pre-formed portion 1522 can be subjected to treatment or processing to, for example, provide a desired exterior profile to the portion. As illustrated in FIG. 18, this includes machining or otherwise removing material from the portion to achieve a desired curved profile. Further, as described above with respect to FIG. 14 and method 1200, the second portion can be provided in a moldable form adjacent to the first portion and solidified to thereby join the first and second portions, for example by die casting or metal injection molding. In some examples, the casting or molding process can also form one or more features 1532 in at least the second portion substantially simultaneous with the joining step. The joined composite unitary body can then be subjected to further processing, as described herein, for example, to provide a surface treatment or treatments, or to further define or form features in the first and/or second portion.

Any of the features or aspects of the composite components discussed herein can be combined or included in any varied combination. For example, the design and shape of the exterior or first portion and the interior or second portion is not limited in any way and can be formed by any number of processes, including those discussed herein. Further, a first portion can be joined with a second portion at any time and by any known method, even during formation of one or both portions. A composite component, as discussed herein, can be or can form all or a portion of a component, such as a housing or enclosure, for an electronic device. The composite component can also be or form any number of additional components of an electronic device, including internal components, external components, cases, surfaces, or partial surfaces.

As used herein, the terms exterior, outer, interior, and inner are used for reference purposes only. An exterior or outer portion of a composite component can form a portion of an exterior surface of the component, but may not necessarily form the entire exterior of outer surface thereof. Similarly, the interior or inner portion of a composite component can form or define an interior or inner portion of the component, but can also form or define a portion of an exterior or outer surface of the component.

Various inventions have been described herein with reference to certain specific embodiments and examples. However, they will be recognized by those skilled in the art that many variations are possible without departing from the scope and spirit of the inventions disclosed herein, in that those inventions set forth in the claims below are intended to cover all variations and modifications of the inventions disclosed without departing from the spirit of the inventions. The terms "including:" and "having" come as used in the specification and claims shall have the same meaning as the term "comprising."

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not target to be exhaustive or to limit the embodiments to the precise forms disclosed. It will be apparent to one of ordinary skill in the art that many modifications and variations are possible in view of the above teachings.

What is claimed is:

1. A housing of an electronic device, comprising:
   an elongate shell including a first metal having a first set of material properties and a surface having a substantially curved shape, the surface at least partially defining an exterior surface of the electronic device, the elongate_shell defining an engagement feature; and
   an interior portion including a second metal having a second set of material properties independent of the first set of material properties and at least partially defining the engagement feature, the interior portion being bonded to the first metal of the elongate shell and disposed interior to the surface;
   wherein the engagement feature defines a through hole having a central axis extending longitudinally along the elongate shell, the through hole defined and surrounded by the elongate shell and the interior portion.

2. The housing of claim 1, wherein:
   the elongate shell is pre-formed and has a thickness greater than about 25 microns; and
   the interior portion and the elongate shell form a substantially unitary body.

3. The housing of claim 1, wherein the housing is positioned around a periphery of the electronic device and the surface at least partially defines a peripheral surface of the electronic device.

4. The housing of claim 1, wherein the interior portion is bonded to the elongate shell by welding, brazing, diffusion bonding, or mechanical engagement.

5. The housing of claim 1, further comprising an intermediate polymer layer disposed between the elongate shell and the interior portion, the intermediate polymer layer bonding the interior portion to the elongate shell.

6. The housing of claim 1, wherein the second metal is different than the first material.

7. A component for an electronic device, comprising:
   a first housing sidewall defining an exterior surface of the electronic device, the first housing sidewall comprising:
     a metal outer portion including a first material having a first set of material properties, the outer portion having a thickness greater than about 25 microns and at least partially defining the-exterior surface of the electronic device and an engagement feature; and
     an inner portion bonded to the outer portion and including a second material having a second set of material properties independent of the first set of material properties, the inner portion defining an interior volume and at least partially defining the engagement feature, the engagement feature comprising an attachment feature for attaching to a part disposed in the interior volume, the attachment feature defining a through hole defined by the first material of the metal outer portion and the second material of the inner portion; and
   a second housing sidewall defining the exterior surface, the second housing sidewall coupled to the first housing sidewall at the engagement feature;
   wherein the inner portion and a pre-formed outer portion form a substantially unitary body.

8. The component of claim 7, wherein the first material comprises steel, aluminum, or titanium and the second material comprises copper, aluminum, or steel that is different than the first material.

9. The component of claim 7, wherein the inner portion is bonded to the pre-formed outer portion by welding, brazing, diffusion bonding, or mechanical engagement.

10. The component of claim 7, wherein the inner portion is bonded to the pre-formed outer portion by die casting the inner portion into the pre- formed outer portion.

11. The component of claim 7, further comprising an intermediate polymer layer disposed between and bonding the inner portion and the pre-formed outer portion.

12. The component of claim 7, wherein the inner portion comprises two layers bonded together and cooperating to define the feature.

13. The component of claim 7, wherein the feature is defined by both the inner portion and the pre-formed outer portion.

14. A method of forming a part for an electronic device, comprising:
joining a pre-formed portion including a first material having a first material property to a second portion including a second material having a second material property independent of the first material property to form a unitary elongate body, the second portion defining an interior volume of the electronic device; and
forming one or more features in the second portion, the features defined by the pre-formed portion and the second portion and comprising an attachment feature configured to attach to a component disposed in the interior volume, the attachment feature defining a through hole axially aligned parallel with the elongate body, the through hole defined and surrounded by the first material and the second material.

15. The method of claim 14, wherein joining comprises welding or brazing the second portion to the pre-formed portion.

16. The method of claim 14, wherein joining comprises providing an intermediate layer between pre-formed portion and second portion.

17. The method of claim 14, wherein joining comprises die casting the second portion into the pre-formed portion.

18. A composite structure, comprising:
a first shell material having a first set of material properties and defining a curved surface and a machined engagement feature defining a through hole, the curved surface at least partially defining an elongate exterior portion of an electronic device; and
a second core material having a second set of material properties independent of the first set of material properties and at least partially defining the machined engagement feature, the second core material disposed interior to the curved surface;
wherein:
the through hole is enclosed by the first shell material and the second core material; and
the through hole defines a central longitudinal axis generally parallel to the elongate exterior portion.

* * * * *